United States Patent
Kim et al.

(10) Patent No.: US 11,970,557 B2
(45) Date of Patent: Apr. 30, 2024

(54) POLYMER CONTAINING PHOTOACID GENERATOR

(71) Applicant: LG CHEM, LTD., Seoul (KR)

(72) Inventors: Jihye Kim, Daejeon (KR); Sung Ho Chun, Daejeon (KR); Minyoung Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 911 days.

(21) Appl. No.: 16/977,739

(22) PCT Filed: Oct. 31, 2019

(86) PCT No.: PCT/KR2019/014567
§ 371 (c)(1),
(2) Date: Sep. 2, 2020

(87) PCT Pub. No.: WO2020/091445
PCT Pub. Date: May 7, 2020

(65) Prior Publication Data
US 2021/0102021 A1    Apr. 8, 2021

(30) Foreign Application Priority Data

Oct. 31, 2018   (KR) .......................... 10-2018-0131891

(51) Int. Cl.
*C08F 232/02*   (2006.01)
*C08F 8/34*   (2006.01)
*G03F 7/039*   (2006.01)

(52) U.S. Cl.
CPC .............. *C08F 232/02* (2013.01); *C08F 8/34* (2013.01); *G03F 7/039* (2013.01)

(58) Field of Classification Search
CPC .............................. C08F 232/02; G03F 7/0395
See application file for complete search history.

(56) References Cited

U.S. PATENT DOCUMENTS

| | | |
|---|---|---|
| 2006/0188806 A1 | 8/2006 | Lee et al. |
| 2009/0318652 A1 | 12/2009 | Nagai et al. |
| 2010/0055608 A1 | 3/2010 | Ohashi et al. |
| 2011/0098433 A1 | 4/2011 | Lee et al. |
| 2011/0250538 A1 | 10/2011 | Li et al. |

FOREIGN PATENT DOCUMENTS

| | | |
|---|---|---|
| JP | 2006-259509 A | 9/2006 |
| JP | 2009-192617 A | 8/2009 |
| JP | 2009-192618 A | 8/2009 |
| KR | 10-2000-0027803 A | 5/2000 |
| KR | 10-2006-0092593 A | 8/2006 |
| KR | 10-2008-0081967 A | 9/2008 |
| KR | 10-2010-0021886 A | 2/2010 |
| KR | 10-2010-0027024 A | 3/2010 |
| KR | 10-2011-0066115 A | 6/2011 |

OTHER PUBLICATIONS

International Search Report and Written Opinion issued for International Application No. PCT/KR2019/014567 dated Feb. 11, 2020, 6 pages.

Shin et al. "Study of acid diffusion of anionic or cationic polymer bound PAG", Journal of Membrane Science, (2011) vol. 367, pp. 340-352.

*Primary Examiner* — Fred M Teskin
(74) *Attorney, Agent, or Firm* — ROTHWELL, FIGG, ERNST & MANBECK, P.C.

(57) ABSTRACT

A polymer capable of securing pattern uniformity in a photoresist pattern, the polymer containing a photoacid generator by including a structure unit represented by Chemical Formula 1a; and a structure unit represented by Chemical Formula 1b as shown in the specification.

10 Claims, No Drawings

POLYMER CONTAINING PHOTOACID GENERATOR

TECHNICAL FIELD

The present disclosure relates to a polymer including a photoacid generator.

This application is a 35 U.S.C. 371 National Phase Entry Application from PCT/KR2019/014567 filed on Oct. 31, 2019, designating the United States, which claims priority to and the benefits of Korean Patent Application No. 10-2018-0131891, filed with the Korean Intellectual Property Office on Oct. 31, 2018, the entire contents of which are incorporated herein by reference.

BACKGROUND OF THE INVENTION

High integration of a semiconductor has been advanced along with the development of photolithography technologies unmatched by other patterning techniques in terms of performance, reliability, and human and physical infrastructures. Particularly, as a shorter light source and a matching photochemical reaction photoresist are used, the degree of device integration has rapidly increased with the development of KrF excimer laser (248 nm) and ArF laser (193 nm) lithography technologies using a high sensitivity chemical amplification-type photoresist.

Through various attempts to change a composition of a photosensitive composition, sensitivity, resolution, line width roughness and the like have been enhanced. Among these, various photoactive compounds to be used in a photosensitive composition have been proposed. Particularly, a customized photoacid generator (PAG) controlling acid diffusion and improving miscibility with a polymer is very important for high resolution lithography. For example, when a photoacid generator is not uniformly distributed in a resist film, defects such as T-topping, foot formation and notching may occur in the imaged photoresist film.

A structure of a photoacid generator affects an interaction between the photoacid generator and other photoresist constituents, and thereby performs an important role in overall performance of a photoresist. The interaction has a significant effect on the diffusion of an acid generated by light irradiation. Studies on photoacid generators having specific structural, chemical and physical properties to improve acid diffusion properties and improve miscibility with other photoresist constituents have been continued.

BRIEF SUMMARY OF THE INVENTION

The present disclosure is directed to providing a polymer capable of securing pattern uniformity by improving line width roughness (LWR) of a photoresist pattern.

In view of the above, the present disclosure includes a photoacid generator in a polymer(A). In one embodiment, the polymer(A) includes a structure unit represented by the following Chemical Formula 1a; and a structure unit represented by the following Chemical Formula 1b.

[Chemical Formula 1a]

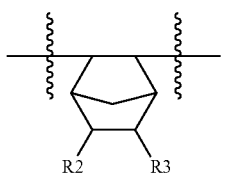

-continued

[Chemical Formula 1b]

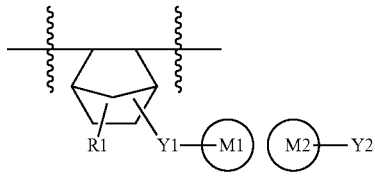

In Chemical Formulae 1a and 1b,

M1 is an organic cation, and M2 is an organic anion,

Y1 is any one group selected from the group consisting of a linear or branched alkylene group; a divalent saturated hydrocarbon ring group; a divalent aromatic hydrocarbon group; a divalent saturated heteroring group; a divalent aromatic heteroring group; a divalent ring group in which two or more rings of a saturated hydrocarbon ring, an aromatic hydrocarbon, a saturated heteroring and an aromatic heteroring are fused; —O—; —C(=O)—; —C(=O)O—; —C(=O)N(R19)-; —N(R19); —S—; —S(=O)—; —S(=O)$_2$—; and —S(=O)$_2$O—, or a group linking two or more of the groups selected from the above-described group, and R19 is hydrogen; deuterium; an alkyl group; a saturated hydrocarbon ring group; or an aromatic hydrocarbon group, and two or more R19s are the same as or different from each other, Y2 and R1 to R3 are the same as or different from each other, and each independently any one group selected from the group consisting of hydrogen; deuterium; a halogen group; a nitrile group; an alkyl group; a saturated hydrocarbon ring group; an aromatic hydrocarbon group; a saturated heteroring group; an aromatic heteroring group; a ring group in which two or more rings of a saturated hydrocarbon ring, an aromatic hydrocarbon, a saturated heteroring and an aromatic heteroring are fused; —OR; —OC(=O)R; —C(=O)R; —C(=O)OR; —C(=O)NR$_2$; —NR$_2$; —SR; —S(=O)R; —S(=O)$_2$R; and —S(=O)$_2$OR, or a group linking two or more of the groups selected from the above-described group, and R is hydrogen; deuterium; an alkyl group; a saturated hydrocarbon ring group; an aromatic hydrocarbon group; a saturated heteroring group; an aromatic heteroring group; or a ring group in which two or more rings of a saturated hydrocarbon ring, an aromatic hydrocarbon, a saturated heteroring and an aromatic heteroring are fused, and two or more Rs are the same as or different from each other, and R1 to R3, Y1 and Y2 may be each independently further substituted with deuterium; a halogen group; a hydroxyl group; an oxo group (=O); or an alkyl group.

Advantageous Effects

A pattern formed with a composition including a polymer (A) of the present disclosure has excellent optimum exposure and/or line width roughness (LWR).

The polymer(A) of the present disclosure can be used to obtain a micropattern for a semiconductor.

DETAILED DESCRIPTION OF THE INVENTION

Before describing one embodiment of the present disclosure, several terms of the present specification will be clarified first.

In addition, when used in the present specification, "comprise" and/or "comprising" are to specify the presence of shapes, numbers, steps, operations, members, elements and/or groups thereof mentioned, and not to exclude the presence or addition of one or more other shapes, numbers, operations, members, elements and/or groups thereof.

In the present specification, a weight average molecular weight is a standard polystyrene converted weight average molecular weight measured using gel permeation chromatography (GPC).

In one embodiment, the weight average molecular weight may be measured using gel permeation chromatography (GPC, Waters Corporation, Waters707) as follows. A compound (0.2 mg) to measure is dissolved in tetrahydrofuran (10 mg) to prepare a sample. After introducing the tetrahydrofuran as a mobile phase at a flow rate of 1 ml/minute, the weight average molecular weight is measured at 35° C. using a detector (RI and PAD detector).

In the present specification, ⁃ξ⁃ represents a site linked to other units or substituents.

In the present specification, an organic group means a monovalent compound formed with carbon, hydrogen and non-metallic elements (oxygen, nitrogen, chlorine or the like). The organic group includes all of non-cyclic compounds, compounds forming a ring, heteroring compounds and the like.

Hereinafter, several embodiments of the present disclosure will be described in detail. However, the scope of ideas and technologies of the present disclosure is not limited to specific embodiments of the present disclosure to describe below, and various changes, equivalents or substituents are all included.

A polymer(A) according to one embodiment of the present disclosure is a chemical amplification-type compound for an electron beam or extreme ultraviolet rays.

The polymer(A) according to one embodiment of the present disclosure may be included in a photosensitive composition for forming a photoresist pattern.

In the present disclosure, when exposing a coating layer formed with a composition including the polymer(A), the light-irradiated portion of the polymer(A) is decomposed and changed to have a property readily dissolved in a developing solution. By removing the area exposed through an exposure process using a developing solution, a pattern may be formed.

The polymer(A) according to one embodiment of the present specification includes a structure unit represented by the following Chemical Formula 1a; and a structure unit represented by the following Chemical Formula 1b.

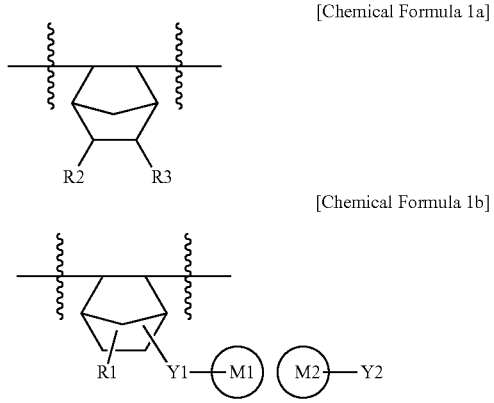

[Chemical Formula 1a]

[Chemical Formula 1b]

In Chemical Formulae 1a and 1b,

M1 is an organic cation, and M2 is an organic anion,

Y1 is any one group selected from the group consisting of a linear or branched alkylene group; a divalent saturated hydrocarbon ring group; a divalent aromatic hydrocarbon group; a divalent saturated heteroring group; a divalent aromatic heteroring group; a divalent ring group in which two or more rings of a saturated hydrocarbon ring, an aromatic hydrocarbon, a saturated heteroring and an aromatic heteroring are fused; —O—; —C(=O)—; —C(=O)O—; —C(=O)N(R19)-; —N(R19); —S—; —S(=O)—; —S(=O)$_2$—; and —S(=O)$_2$O—, or a group linking two or more of the groups selected from the above-described group, and R19 is hydrogen; deuterium; an alkyl group; a saturated hydrocarbon ring group; or an aromatic hydrocarbon group, and two or more R19s are the same as or different from each other, Y2 and R1 to R3 are the same as or different from each other, and each independently any one group selected from the group consisting of hydrogen; deuterium; a halogen group; a nitrile group; an alkyl group; a saturated hydrocarbon ring group; an aromatic hydrocarbon group; a saturated heteroring group; an aromatic heteroring group; a ring group in which two or more rings of a saturated hydrocarbon ring, an aromatic hydrocarbon, a saturated heteroring and an aromatic heteroring are fused; —OR; —OC(=O)R; —C(=O)R; —C(=O)OR; —C(=O)NR$_2$; —NR$_2$; —SR; —S(=O)R; —S(=O)$_2$R; and —S(=O)$_2$OR, or a group linking two or more of the groups selected from the above-described group, and R is hydrogen; deuterium; an alkyl group; a saturated hydrocarbon ring group; an aromatic hydrocarbon group; a saturated heteroring group; an aromatic heteroring group; or a ring group in which two or more rings of a saturated hydrocarbon ring, an aromatic hydrocarbon, a saturated heteroring and an aromatic heteroring are fused, and two or more Rs are the same as or different from each other, and R1 to R3, Y1 and Y2 may be each independently further substituted with deuterium; a halogen group; a hydroxyl group; an oxo group (=O); or an alkyl group.

In one embodiment, the polymer(A) may be a random, alternating or block polymer.

In one embodiment, the polymer(A) may be a random polymer of the structure unit represented by Chemical Formula 1a; and the structure unit represented by Chemical Formula 1b.

In one embodiment, M1 and M2 of Chemical Formula 1b are an organic cation and an organic anion, respectively, and present while forming an ionic bond with each other.

In the present specification, the halogen group may include a fluoro group, a bromo group, an iodine group and the like.

In the present specification, the linear alkylene group may include —CH$_2$—; —(CH$_2$)$_2$—; —(CH$_2$)$_3$— and the like, but is not limited thereto.

In the present specification, the branched alkylene group may mean —CH(CH$_3$)—; —C(CH$_3$)$_2$—; —C(CH$_3$)(CH$_2$CH$_3$)—; —CH$_2$CH(CH$_3$)CH$_2$— or and like, but is not limited thereto.

In the present specification, the saturated hydrocarbon ring group means a monovalent group removing one hydrogen from a monocyclic or polycyclic saturated hydrocarbon ring.

The monocyclic saturated hydrocarbon ring means cycloalkane. The cycloalkane may include cyclopropane, cyclobutane, cyclopentane, cyclohexane and the like, but is not limited thereto.

The polycyclic saturated hydrocarbon ring includes bicyclo-type cycloalkane; or spiro-type cycloalkane. The bicyclo-type alkane includes fused cycloalkane; and bridged cycloalkane.

The fused cycloalkane means a fused ring of cycloalkane sharing an adjacent carbon atomic pair. The bridged cycloalkane means a saturated hydrocarbon ring in which two carbons that are not adjacent in the ring are linked through a direct bond or an alkylene group. The spiro-bonded cycloalkane means a saturated hydrocarbon ring linked while sharing one carbon atom.

Examples of the polycyclic saturated hydrocarbon ring may include adamantane; norbornane; tricyclodecane; bicyclo[3.1.1]heptane; decalin; octahydro-1H-4,7-methanoindene; octahydro-1H-4,7-ethanoindene; bicyclo[3.1.0]hexane; bicyclo[2.2.1]heptane; bicyclo[3.2.0]heptane; bicyclo[3.1.1]heptane; bicyclo[4.1.0]heptane; bicyclo[3.2.1]octane; bicyclo[2.2.2]octane; bicyclo[4.2.0]octane; bicyclo[3.2.2]nonane; bicyclo[4.4.0]decane; spiro[4.3]octane; spiro[5.2]octane; spiro[5.4]decane and the like, but are not limited thereto.

In the present specification, the aromatic hydrocarbon may include benzene, naphthalene, anthracene, tetracene, triphenylene, phenanthrene and the like, but is not limited thereto.

In the present specification, the saturated heteroring means a ring in which one or more carbons in the saturated hydrocarbon ring are substituted with S, O, N or Si.

In the present specification, the aromatic heteroring means a ring formed with two or more elements while having aromaticity.

In one embodiment, Y1 is any one group selected from the group consisting of a linear or branched alkylene group; a divalent saturated hydrocarbon ring group; a divalent aromatic hydrocarbon group; a divalent ring group in which a saturated hydrocarbon ring and an aromatic hydrocarbon are fused; —O—; —S—; —C(=O)—; —C(=O)O—; and —C(=O)NH—, or a group linking two or more of the groups selected from the above-described group.

In one embodiment, Y1 is any one group selected from the group consisting of a linear or branched alkylene group; —O—; and —S—, or a group linking two or more of the groups selected from the above-described group.

When a resin and a photoacid generator included in a composition do not have favorable miscibility and compatibility, the photoacid generator may not be uniformly distributed in a photosensitive film. When there is a difference in the photoacid generator content in each part, there is a difference in the amount of acid generated in each part during exposure, and the amount of the resin dissolved in a developing solution in each part becomes different as well. In this case, line width roughness (LWR) of a photoresist pattern increases making it difficult to control a micropattern.

On the other hand, in the polymer(A) of the present disclosure, a group generating acid when irradiating light (photoacid generator) bonds to a polymer of a monomer including norbornene or a norbornene derivative, and therefore, the photoacid generator may be uniformly distributed in a photosensitive composition. As a result, a compatibility problem between the resin and the photoacid generator does not occur resulting in improving line width roughness (LWR).

In one embodiment, the polymer(A) is a random polymer of the structure unit represented by Chemical Formula 1a; and the structure unit represented by Chemical Formula 1b. In this case, main chain of the polymer(A) is formed with a norbornane ring. In the present specification, the main chain of the polymer means a stem molecular chain forming a skeleton of the polymer.

When the main chain of the polymer(A) is formed with a norbornane ring, a higher glass transition temperature (Tg) is obtained compared to a compound having the main chain formed with an alkylene group. As a compound has a lower glass transition temperature (Tg), fluidity of a resin increases when heat treating after exposure, which is advantageous for acid diffusion, however, there is a problem in that, as the acid diffusion is faster, line width roughness increases when forming a micropattern. When the resin and the photoacid generator are employed to have a high glass transition temperature, diffusion of an acid generated from the photoacid generator is not large during exposure, and a micropattern having a relatively uniform pattern width may be obtained.

In the present specification, the glass transition temperature may be measured using a differential scanning calorimetry (DSC). In one embodiment, the glass transition temperature may be measured using DSC3 of Mettler Toledo.

In one embodiment, the polymer(A) has a weight average molecular weight of 3,000 g/mol to 15,000 g/mol. When the weight average molecular weight of the polymer(A) is less than 3,000 g/mol, cracks may occur on the photosensitive film, and when the weight average molecular weight is greater than 15,000 g/mol, sensitivity decreases causing a foot occurrence.

In one embodiment, the polymer(A) has a weight average molecular weight of 15,000 g/mol or less; 12,000 g/mol or less; 9,000 g/mol or less; or 7,000 g/mol or less.

In one embodiment, the structure unit represented by Chemical Formula 1a is included in 80 mol % to 99.9 mol % with respect to the whole structure unit included in the polymer(A).

In one embodiment, the structure unit represented by Chemical Formula 1b is included in 0.1 mol % to 20 mol % with respect to the whole structure unit included in the polymer(A). In one embodiment, when the structure unit represented by Chemical Formula 1b is included in greater than above-mentioned range, pattern resolution may decrease. In one embodiment, the structure unit represented by Chemical Formula 1a is included in 80 mol % to 99.9 mol % with respect to the whole structure unit included in the polymer(A), and the structure unit represented by Chemical Formula 1b is included in 0.1 mol % to 20 mol % with respect to the whole structure unit included in the polymer (A).

In one embodiment, Chemical Formula 1b is represented by the following Chemical Formula 1c.

[Chemical Formula 1c]

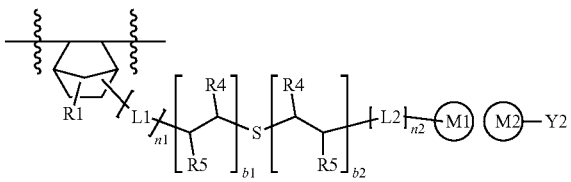

In Chemical Formula 1c,

R1, M1, M2 and Y2 have the same definitions as in Chemical Formula 1b,

L1 and L2 are the same as or different from each other, and each independently any one group selected from the group consisting of a linear or branched alkylene group; a divalent saturated hydrocarbon ring group; a divalent aromatic hydrocarbon group; a divalent saturated heteroring group; a divalent aromatic heteroring group; a divalent ring group in which two or more rings of a saturated hydrocarbon ring, an aromatic hydrocarbon, a saturated heteroring and an aromatic heteroring are fused; —O—; —C(=O)—; —C(=O)O—; —C(=O)N(R19)-; —N(R19); —S—; —S(=O)—; —S(=O)$_2$—; and —S(=O)$_2$O—, or a group linking two or more of the groups selected from the above-described group, and R19 is hydrogen; deuterium; an alkyl group; a saturated hydrocarbon ring group; or an aromatic hydrocarbon group, and two or more R19s are the same as or different from each other, L1 and L2 are the same as or different from each other, and may be each independently further substituted with deuterium; a halogen group; a hydroxyl group; an oxo group (=O); or an alkyl group, n1 is an integer of 0 or greater, and when n1 is 2 or greater, L1s are the same as or different from each other, n2 is an integer of 0 or greater, and when n2 is 2 or greater, L2s are the same as or different from each other, R4 and R5 are the same as or different from each other, and each independently have the same definition as R1, and b1 is 0 or 1, b2 is 0 or 1, and a sum of b1 and b2 is 1.

In one embodiment, L1 and L2 are the same as or different from each other, and each independently any one group selected from the group consisting of a linear or branched alkylene group; a divalent saturated hydrocarbon ring group; a divalent aromatic hydrocarbon group; a divalent ring group in which a saturated hydrocarbon ring and an aromatic hydrocarbon are fused; —O—; —C(=O)—; —C(=O)O—; and —C(=O)N(R19)-, or a group linking two or more of the groups selected from the above-described group, and R19 is hydrogen; deuterium; an alkyl group; a saturated hydrocarbon ring group; or an aromatic hydrocarbon group, and two or more R19s are the same as or different from each other.

In one embodiment, L1 is any one group selected from the group consisting of a linear or branched alkylene group; a divalent saturated hydrocarbon ring group; —O—; and —C(=O)—, or a group linking two or more of the groups selected from the above-described group, and L1 may be further substituted with deuterium; a halogen group; a hydroxyl group; an oxo group (=O); or an alkyl group.

In one embodiment, n1 is an integer of 1 to 10; 1 to 8; 1 to 6; or 1 to 4.

In one embodiment, L2 is any one group selected from the group consisting of a linear or branched alkylene group; a divalent saturated hydrocarbon ring group; and a divalent aromatic hydrocarbon group, or a group linking two or more of the groups selected from the above-described group, and L2 may be further substituted with deuterium; a halogen group; a hydroxyl group; an oxo group (=O); or an aliphatic hydrocarbon group.

In one embodiment, n2 is an integer of 1 to 10; 1 to 8; 1 to 6; or 1 to 4.

In one embodiment, R1 is hydrogen.

In one embodiment, R2 is hydrogen.

In one embodiment, R3 is represented by the following Chemical Formula 4.

[Chemical Formula 4]

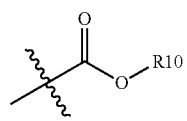

In Chemical Formula 4,

R10 is any one group selected from the group consisting of deuterium; a halogen group; a linear or branched alkyl group; a haloalkyl group; a saturated hydrocarbon ring group; an aromatic hydrocarbon group; a saturated heteroring group; an aromatic heteroring group; a ring group in which two or more rings of a saturated hydrocarbon ring, an aromatic hydrocarbon, a saturated heteroring and an aromatic heteroring are fused; —OR'; —OC(=O)R'; —C(=O)R'; —C(=O)OR'; —C(=O)NR'$_2$; —NR'$_2$; —SR'; —S(=O)R'; —S(=O)$_2$R'; and —S(=O)$_2$OR', or a group linking two or more of the groups selected from the above-described group, and R' is hydrogen; deuterium; an alkyl group; a saturated hydrocarbon ring group; an aromatic hydrocarbon group; a saturated heteroring group; an aromatic heteroring group; or a ring group in which two or more rings of a saturated hydrocarbon ring, an aromatic hydrocarbon, a saturated heteroring and an aromatic heteroring are fused, two or more R's are the same as or different from each other, and R10 may be further substituted with an oxo group.

In one embodiment, R10 is any one group selected from the group consisting of a linear or branched alkyl group; a saturated hydrocarbon ring group; an aromatic hydrocarbon group; a saturated heteroring group; an aromatic heteroring group; a ring group in which two or more rings of a saturated hydrocarbon ring, an aromatic hydrocarbon, a saturated heteroring and an aromatic heteroring are fused; —OR'; —OC(=O)R'; —C(=O)R'; and —C(=O)OR', or a group linking two or more of the groups selected from the above-described group, and R' is hydrogen; deuterium; an alkyl group; a saturated hydrocarbon ring group; an aromatic hydrocarbon group; or a ring group in which two or more rings of a saturated hydrocarbon ring, an aromatic hydrocarbon, a saturated heteroring and an aromatic heteroring are fused, two or more R's are the same as or different from each other, and R10 may be further substituted with an oxo group.

In one embodiment, R10 is any one group selected from the group consisting of deuterium; a halogen group; a hydroxyl group; an alkoxy group; an aryloxy group; a haloalkyl group; an alkyl group; and a saturated hydrocarbon ring group unsubstituted or substituted with an oxo group (=O), or a group linking two or more of the groups selected from the above-described group.

In one embodiment, R10 is a saturated hydrocarbon ring group in which an alkyl group or a hydroxyl group is linked.

In one embodiment, R10 is an adamantanyl group in which an alkyl group or a hydroxyl group is linked.

In one embodiment, b1 is 1.

In one embodiment, b2 is 1.

In one embodiment, M1 is represented by any one of the following Chemical Formula a-1 to Chemical Formula a-3.

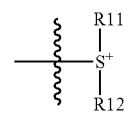

(a-1)

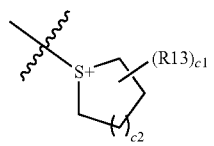

(a-2)

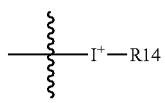

(a-3)

In Chemical Formula a-1 to Chemical Formula a-3,

⁓ represents a site linked to Y1,

R11 to R14 are the same as or different from each other, and each independently hydrogen; a linear or branched alkyl group; a saturated hydrocarbon ring group; an aromatic hydrocarbon group; a saturated heteroring group; an aromatic heteroring group; or a ring group in which two or more rings of a saturated hydrocarbon ring, an aromatic hydrocarbon, a saturated heteroring and an aromatic heteroring are fused, R11 to R14 are the same as or different from each other, and may be each independently further substituted with deuterium; a halogen group; a hydroxyl group; an alkoxy group; an oxo group (=O); or an alkyl group, c1 is an integer of 0 or greater, and when c1 is 2 or greater, R13s are the same as or different from each other, and c2 is an integer of 1 to 10.

In one embodiment, M1 of Chemical Formula 1c is represented by Chemical Formula a-1 to Chemical Formula a-3, and herein, ⁓ represents a site linked to L2.

In one embodiment, R11 to R14 are the same as or different from each other, and may be each independently an alkyl group such as a methyl group, an ethyl group, a propyl group, an isopropyl group, an n-butyl group, a sec-butyl group, a tert-butyl group, a pentyl group, a hexyl group, a heptyl group, an octyl group, a benzylmethyl group, a phenylethyl group, a 2-oxopropyl group, a 2-cyclopentyl-1-oxoethyl group, a 2-cyclohexyl-1-oxoethyl group, a 2-(4-methylcyclohexyl)-1-oxoethyl group, a 2-phenyl-1-oxoethyl group, a 2-(1-naphthyl)-1-oxoethyl group and a 2-(2-naphthyl)-1-oxoethyl group; a saturated hydrocarbon ring group such as a cyclopentyl group, a cyclohexyl group, a cycloheptyl group, a cyclopropyl group, a 2-methylcyclohexyl group, a 3-methylcyclohexyl group, a norbornyl group, an adamantanyl group, a 2-oxocyclopentyl group and a 2-oxocyclohexyl group; or an aromatic hydrocarbon group such as a phenyl group, a naphthyl group, a p-methoxyphenyl group, an m-methoxyphenyl group, an o-methoxyphenyl group, an ethoxyphenyl group, a p-tert-butoxyphenyl group, an m-tert-butoxyphenyl group, a 2-methylphenyl group, a 3-methylphenyl group, a 4-methylphenyl group, an ethylphenyl group, a 4-tert-butylphenyl group, a 4-butylphenyl group, a dimethylphenyl group, a methylnaphthyl group, an ethylnaphthyl group, a methoxynaphthyl group, an ethoxynaphthyl group, a dimethylnaphthyl group, a diethylnaphthyl group, a dimethoxynaphthyl group or a diethoxynaphthyl group.

In one embodiment, R11 to R14 are the same as or different from each other, and each independently hydrogen; or a C6-C30 aromatic hydrocarbon group.

In one embodiment, R11 to R14 are the same as or different from each other, and each independently hydrogen; or a phenyl group.

In one embodiment, R11 and R12 are a phenyl group.

In one embodiment, R14 is a phenyl group.

In one embodiment, c2 is an integer of 1 to 3.

In one embodiment, M2-Y2 is represented by the following Chemical Formula 10.

[Chemical Formula 10]

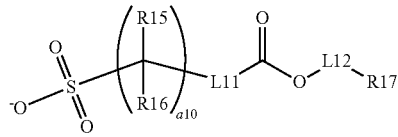

In Chemical Formula 10,

R15 is a halogen group, and R16 is a halogen group, a10 is an integer of 1 to 5, and when a10 is 2 or greater, the two or more R15s and R16s are each the same as or different from each other, L11 and L12 are the same as or different from each other, and each independently any one group selected from the group consisting of a single bond; a linear or branched alkylene group; a divalent saturated hydrocarbon ring group; a divalent aromatic hydrocarbon group; a divalent saturated heteroring group; a divalent aromatic heteroring group; a divalent ring group in which two or more rings of a saturated hydrocarbon ring, an aromatic hydrocarbon, a saturated heteroring and an aromatic heteroring are fused; —O—; —C(=O)—; —C(=O)O—; —C(=O)N(R19)-; —N(R19); —S—; —S(=O)—; —S(=O)₂—; and —S(=O)₂O—, or a group linking two or more of the groups selected from the above-described group, and R19 is hydrogen; deuterium; an alkyl group; a saturated hydrocarbon ring group; or an aromatic hydrocarbon group, and two or more R19s are the same as or different from each other, R17 is a saturated hydrocarbon ring, and L11, L12 and R17 are the same as or different from each other, and may be each independently further substituted with deuterium; a halogen group; a hydroxyl group; an oxo group (=O); or an alkyl group.

In one embodiment, R15 is a fluoro group.

In one embodiment, R16 is a fluoro group.

In one embodiment, a10 is 1 or 2.

In one embodiment, L11 is a single bond.

In one embodiment, L12 is a linear alkylene group.

In one embodiment, L12 is a linear alkylene group of C1-C15; C1-C10; C1-C6; or C1-C4.

In one embodiment, R17 is an adamantanyl group unsubstituted or substituted with a hydroxyl group.

In one embodiment, the polymer(A) may be included in a photosensitive composition to form a photosensitive film.

In one embodiment, the photosensitive composition may further include a photoacid generator.

In one embodiment, the photoacid generator may be one, two or more types selected from the group consisting of a sulfonium salt; an iodonium salt; a diazonium salt; a phosphonium salt; a pyridinium salt; a halogen-containing compound; a sulfone compound; a sulfonate ester compound; a quinonediazide compound; and a diazomethane compound, but is not limited thereto.

Examples of the sulfonium salt may include diphenyl(4-phenylthiophenyl)sulfonium hexafluoroantimonate, 4,4'-bis[diphenylsulfonio]phenylsulfide bishexafluoroantimonate and a combination thereof, triphenylsulfonium nonafluorobutanesulfonate, triphenylsulfonium trifluoromethanesulfonate, triphenylsulfonium pyrenesulfonate, triphenylsulfonium dodecylbenzenesulfonate, triphenylsulfonium p-toluenesulfonate, triphenylsulfonium benzenesulfonate, triphenylsulfonium 10-camphorsulfonate, triphenylsulfonium octanesulfonate, triphenylsulfonium 2-trifluoromethylbenzenesulfonate, triphenylsulfonium hexafluoroantimonate and the like, but are not limited thereto.

Examples of the iodonium salt may include diphenyliodonium trifluoromethanesulfonate, diphenyliodonium pyrenesulfonate, diphenyliodonium dodecylbenzenesulfonate, diphenyliodonium p-toluenesulfonate, diphenyliodonium benzenesulfonate, diphenyliodonium 10-camphorsulfonate, diphenyliodonium octanesulfonate, diphenyliodonium 2-trifluoromethylbenzenesulfonate, bis(4-t-butylphenyl)iodonium nonafluorobutanesulfonate and the like, but are not limited thereto.

Examples of the diazonium salt may include phenyldiazonium hexafluorophosphate, phenyldiazonium hexafluoroantimonate, phenyldiazonium tetrafluoroborate, phenyldiazonium tetrakis(pentafluorophenyl)borate and the like, but are not limited thereto.

Examples of the phosphonium salt may include triphenylphosphonium chloride, triphenylphosphonium bromide, tri(p-methoxyphenyl)phosphonium tetrafluoroborate, tri(p-methoxyphenyl)phosphonium hexafluorophosphonate, tri(p-ethoxyphenyl)phosphonium tetrafluoroborate, benzyltriphenylphosphonium hexafluoroantimonate and the like, but are not limited thereto.

Examples of the pyridinium salt may include 1-benzyl-2-cyanopyridinium hexafluorophosphate, 1-benzyl-2-cyanopyridinium hexafluoroantimonate, 1-benzyl-2-cyanopyridinium tetrafluoroborate, 1-benzyl-2-cyanopyridinium tetrakis(pentafluorophenyl)borate, 1-(naphthylmethyl)-2-cyanopyridinium hexafluorophosphate, 1-(naphthylmethyl)-2-cyanopyridinium hexafluoroantimonate and the like, but are not limited thereto.

The halogen-containing compound includes a haloalkyl group-containing hydrocarbon compound and a haloalkyl group-containing heteroring compound. Examples of the halogen-containing compound may include (poly)trichloromethyl-s-triazine such as phenyl-bis(trichloromethyl)-s-triazine, 4-methoxyphenyl-bis(trichloromethyl)-s-triazine and 1-naphthyl-bis(trichloromethyl)-s-triazine; 1,1-bis(4-chlorophenyl)-2,2,2-trichloroethane, and the like, but is not limited thereto.

Examples of the sulfone compound include β-ketosulfone, β-sulfonylsulfone, and an α-diazo compound thereof. Specific examples of the sulfone compound may include phenacylphenylsulfone, mesitylphenacylsulfone, bis(phenylsulfonyl)methane, 1,1-bis(phenylsulfonyl)cyclobutane, 1,1-bis(phenylsulfonyl)cyclopentane, 1,1-bis(phenylsulfonyl)cyclohexane, 4-trisphenacylsulfone and the like, but are not limited thereto.

The sulfonic acid ester compound includes alkyl sulfonate ester, haloalkyl sulfonate ester, aryl sulfonate ester and amino sulfonate. Examples of the sulfonate ester compound may include benzoin tosylate, pyrogallol tristrifluoromethanesulfonate, pyrogallol trisnonafluorobutanesulfonate, pyrogallol methanesulfonate triester and the like, but are not limited thereto.

Examples of the diazomethane compound may include bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl-p-toluenesulfonyldiazomethane, 1-cyclohexylsulfonyl-1-(1,1-dimethylethylsulfonyl)diazomethane, bis(1,1-dimethylethylsulfonyl)diazomethane and the like, but are not limited thereto.

Examples of the quinonediazide compound may include sulfonic acid ester of a quinonediazide derivative such as 1,2-benzoquinonediazide-4-sulfonic acid ester and 1,2-naphthoquinonediazide-4-sulfonic acid ester; sulfonic acid chloride of a quinonediazide derivative such as 1,2-benzoquinone-2-diazide-4-sulfonic acid chloride, 1,2-naphthoquinone-2-diazide-4-sulfonic acid chloride, 1,2-naphthoquinone-diazide-5-sulfonic acid chloride and 1,2-naphthoquinone-1-diazide-6-sulfonic acid chloride, and the like, but are not limited thereto.

In one embodiment, the photosensitive composition may not include a separate photoacid generator other than the polymer(A). The photoacid generator is a compound generating an acid when irradiating actinic light or radiation. In one embodiment, when the photosensitive composition includes only the polymer(A) as a photoacid generator, line width roughness (LWR) of a pattern may be further reduced.

In one embodiment, the polymer(A) is included in 100 parts by weight with respect to 100 parts by weight of a photoacid generator (compound generating acid when irradiating light) included in the photosensitive composition.

The photosensitive composition may further include a polymer (B) including a structure unit including a hydroxyl group in order to enhance sensitivity control and pattern profile.

In one embodiment, the polymer (A) and the polymer (B) included in the photosensitive composition may have a weight ratio of 8:2 to 4:6; or 7:3 to 5:5. When the content of the polymer(B) is less than the above-mentioned range, a residual film may remain on a substrate after developing a photoresist layer, and when the content of the polymer(B) is greater than the above-mentioned range, development excessively occurs, leading to development of a portion other than a target pattern shape, and the pattern shape may be destroyed.

In one embodiment, the structure unit including a hydroxyl group is a structure unit represented by the following Chemical Formula c-1.

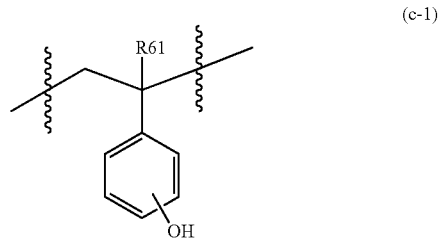

(c-1)

In Chemical Formula c-1,

R61 is hydrogen; or an alkyl group.

In one embodiment, R61 is hydrogen; or a methyl group.

In one embodiment, the OH group of Chemical Formula c-1 bonds to a para position of the benzene.

In one embodiment, the polymer(B) further includes one or more of a structure unit having a hydroxyl group protected with an acid-labile group; and a structure unit having a carboxyl group protected with an acid-labile group.

In the present specification, the acid-labile group means a group having a bond removed by an acid.

The structure unit having a hydroxyl group protected with an acid-labile group may be deprotected to a hydroxyl group under an acid condition, and the structure unit having a carboxyl group protected with an acid-labile group may be deprotected to a carboxylic acid under an acid condition.

In addition, by including the polymer(B), the photosensitive composition of the present disclosure may readily control sensitivity, and a pattern shape may be finely controlled.

In one embodiment, the structure unit having a hydroxyl group protected with an acid-labile group is a structure unit represented by the following Chemical Formula d-1, and the structure unit having a carboxyl group protected with an acid-labile group is a structure unit represented by the following Chemical Formula d-2.

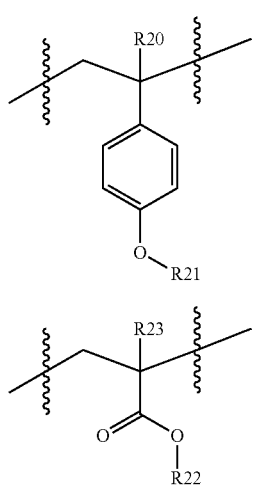

In Chemical Formulae d-1 and d-2,

R21 and R22 are the same as or different from each other, and each independently —Si(R24)(R25)(R26); a ring group substituted or unsubstituted and including lactone; a ring group substituted or unsubstituted and including sulfone; —C(R27)(R28)O(R29); —(CH$_2$)$_n$C(=O)O(R30); —C(R31)(R32)(R33); —C(=O)(R34); a substituted or unsubstituted aliphatic ring group; or a substituted or unsubstituted aromatic ring group, R24 to R34 are the same as or different from each other, and each independently any one group selected from the group consisting of hydrogen; deuterium; a nitrile group; —N(R42)(R43); —C(=O)(R44); —C(=O)O(R45); a substituted or unsubstituted alkyl group; a substituted or unsubstituted aliphatic ring group; and a substituted or unsubstituted aromatic ring group, or a group linking two or more of the groups selected from the above-described group, and R42 to R45 are the same as or different from each other, and each independently hydrogen; deuterium; a substituted or unsubstituted alkyl group; a substituted or unsubstituted aliphatic hydrocarbon group; or a substituted or unsubstituted aromatic hydrocarbon group, n is an integer of 0 to 6, and R20 and R23 are the same as or different from each other, are each independently hydrogen; or an alkyl group.

In one embodiment, in the definitions of the substituents of Chemical Formulae d-1 and d-2, 'substituted or unsubstituted' means being substituted with any one group selected from the group consisting of deuterium; a nitrile group; —O(R46); an oxo group (=O); —N(R47)(R48); —C(=O)(R49); —C(=O)O(R50); an alkyl group; an aliphatic ring group; and an aromatic ring group, or a group linking two or more of the groups selected from the above-described group, or having no substituents, and R46 to R50 are the same as or different from each other, and each independently hydrogen; deuterium; an alkyl group; an aliphatic hydrocarbon group; or an aromatic hydrocarbon group.

In one embodiment, the number of carbon atoms of the alkyl group of R21 and R22 is from 1 to 30; 1 to 20; or 1 to 10.

In one embodiment, the aliphatic ring group of R21 and R22 may be an aliphatic hydrocarbon ring group; or an aliphatic heteroring group including S, O or N. The aliphatic ring group may be monocyclic; or polycyclic. The polycyclic ring includes a bicyclo; or spiro structure form.

In the present specification, the aliphatic ring group means an aliphatic hydrocarbon ring group; and an aliphatic heteroring group. The aliphatic hydrocarbon ring group includes a saturated hydrocarbon ring group and an unsaturated hydrocarbon ring group. The unsaturated hydrocarbon ring group means a group in which some single bonds of a cycloalkyl group, a bicyclo-type cycloalkyl group and a spiro-type cycloalkyl group are replaced by an unsaturated bond. The aliphatic heteroring group means a group in which some carbons of an aliphatic hydrocarbon ring group are substituted with O, S, Se or N.

In one embodiment, R24 to R34 are the same as or different from each other, and each independently a methyl group; an ethyl group; an n-propyl group; an isopropyl group; a tert-butyl group; a cyclopentyl group; a cyclohexyl group; bicyclo[2.2.1]heptane; tricyclo[2.2.1.0$^{2,6}$]heptane; adamantane; tetracyclo[3.2.0.0$^{2,7}$.0$^{4,6}$]heptane; octahydro-1H-indene; octahydro-1H-4,7-methanoindene; decahydro-1,4-methanonaphthalene; decahydro-1,4:5,8-dimethanonaphthalene and the like, but are not limited thereto.

In one embodiment, the —(CH$_2$)$_n$C(=O)O(R30) may be a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group or a 2-tetrahydrofuranyloxycarbonylmethyl group, but is not limited thereto.

In one embodiment, the aliphatic ring group of R21 and R22 may be a cyclopentyl group; a cyclohexyl group; a bicyclo[2.2.1]heptanyl group; a tricyclo[2.2.1.0$^{2,6}$]heptanyl group; adamantane; a tetracyclo[3.2.0.0$^{2,7}$.0$^{4,6}$]heptanyl group; an octahydro-1H-indenyl group; an octahydro-1H-4,7-methanoindenyl group; a decahydro-1,4-methanonaphthyl group; a decahydro-1,4:5,8-dimethanonaphthyl group or the like, but is not limited thereto.

In the present specification, the aromatic ring group may be an aromatic hydrocarbon group; or an aromatic heteroring including O, N, Se or S. Examples of the aromatic hydrocarbon group may include a phenyl group, a biphenyl group, a terphenyl group, a stilbenyl group, a naphthyl group, an anthracenyl group, a phenanthrenyl group, a pyrenyl group, a perylenyl group, a chrysenyl group, a fluorenyl group and the like, but are not limited thereto. Examples of the aromatic heteroring group may include a thiophenyl group, a furanyl group, a pyrrolyl group, an imidazolyl group, a thiazolyl group, an oxazolyl group, an oxadiazolyl group, a triazolyl group, a pyridinyl group, a bipyridinyl group, a pyrimidyl group, a triazinyl group, an acridinyl group, a pyridazinyl group, a pyrazinyl group, a quinolinyl group, a quinazolinyl group, a quinoxalinyl group, a phthalazinyl group, a pyridopyrimidinyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a dibenzocarbazolyl group, a benzothiophenyl group, a dibenzothiophenyl group, a benzofuranyl group, a dibenzofuranyl group; a benzosilole group; a dibenzosilole group; a phenanthrolinyl group, a thiazolyl group, isoxazolyl group, an oxadiazolyl group, a thiadiazolyl group, a benzothiazolyl group, a phenothiazinyl group, a phenoxazinyl group and the like, but are not limited thereto.

In the present specification, the lactone means a cyclic ester, and may be from 5-membered to 7-membered ring. The lactone-including ring includes a ring in which other rings are fused to the lactone in a bicyclo structure or spiro structure form. In one embodiment, the lactone-including ring may be dihydrofuran-2(3H)-one; tetrahydro-2H-pyran-2-one; 6-oxabicyclo[3.2.1]octan-7-one; hexahydro-2H-3,5-methanocyclopenta[b]furan-2-one; tetrahydro-2,6-methanofuro[3,2-b]furan-5(2H)-one; hexahydro-3,6-methanobenzofuran-2(3H)-one; hexahydrobenzofuran-2(3H)-one; hexahydro-4,7-methanobenzofuran-2(3H)-one; 2-oxabicyclo[2.2.2]-octan-3-one; 4-octatricyclo[4.3.0.0$^{3,8}$] nonan-5-one; 2-oxaspiro[4.5]decan-1-one; dihydro-2'H-spiro[bicyclo[2.2.1]heptane-2,3'-furan]2'-one; tetrahydrofuro[3,2-b]furan-2(5H)-one; tetrahydro-2H-cyclopenta[b]furan-2-one; 4-oxatricyclo[4.3.1.1$^{3,8}$]undecan-5-one or the like, but is not limited thereto.

In the present specification, the sulfone means a cyclic sulfonic acid ester, and may be from 5-membered to 7-membered ring. The sulfone-including ring includes a ring in which other rings are fused to the sulfone in a bicyclo structure or spiro structure form. In one embodiment, the sulfone-including ring may be hexahydro-3,5-methanocyclopenta[c][1,2]oxathiol 1,1-dioxide; 1,2-oxathiolane 2,2-dioxide; 1,2-oxathiane 2,2-dioxide or the like, but is not limited thereto.

In one embodiment, R21 and R22 are the same as or different from each other, and may be each independently a trimethylsilyl (TMS) group; a triethylsilyl (TES) group; a t-butyldimethylsilyl (TBS) group; a t-butyldiphenylsilyl (TBS) group; a triisopropylsilyl (TIPS) group; a tetrahydropyranyl (THP) group; a tetrahydrofuranyl (THF) group; a p-methoxybenzylmethyl group; an o-nitrobenzylmethyl group; a p-nitrobenzylmethyl group; an adamantanyl group; —COCH$_3$; —COC(CH$_3$)$_3$; —COCH(CH$_3$)$_2$; —CO(C$_6$H$_5$); a C1-C10 alkyl group; a C3-C12 aliphatic ring group; or a C6-C30 aromatic ring group, but are not limited thereto.

In one embodiment, R20 and R23 are the same as or different from each other, and each independently hydrogen; or a C1-C10 alkyl group.

In one embodiment, R20 and R23 are the same as or different from each other, and each independently hydrogen; or a methyl group.

In one embodiment, the polymer(B) is a random polymer of the structure unit represented by Chemical Formulae d-1 and/or d-2; and the structure unit represented by Chemical Formula c-1.

In one embodiment, the polymer(B) is a polymer in which the structure unit represented by Chemical Formulae d-1 and/or d-2; and the structure unit represented by Chemical Formula c-1 are irregularly arranged linearly.

In one embodiment, the polymer(B) is a polymer in which the structure units represented by Chemical Formulae c-1, d-1 and d-2 are irregularly arranged linearly in a molar ratio of e1:e2:e3. In one embodiment, the e1:e2+e3 is from 9:1 to 5:5; or 8:2 to 6:4.

In one embodiment, the polymer(B) is a polymer in which the structure units represented by Chemical Formulae c-1 and d-1 are irregularly arranged linearly in a molar ratio of f1:f2. In one embodiment, the f1:f2 is from 9:1 to 5:5; or 8:2 to 6:4.

In one embodiment, the polymer(B) is a polymer in which the structure units represented by Chemical Formulae c-1 and d-2 are irregularly arranged linearly in a molar ratio of g1:g2. In one embodiment, the g1:g2 is from 9:1 to 5:5; or 8:2 to 6:4.

In the polymer(B), when the ratio of the structure unit including a group protected with an acid-labile group is less than the above-mentioned range, sensitivity of the polymer (B) is low resulting in a non-uniform pattern shape, and when the ratio is greater than the above-mentioned range, development excessively occurs, leading to development of a portion other than a target pattern shape, and the pattern shape may be destroyed.

In one embodiment, the structure unit represented by Chemical Formula d-1 may be any one selected from among the following structure units, but is not limited thereto.

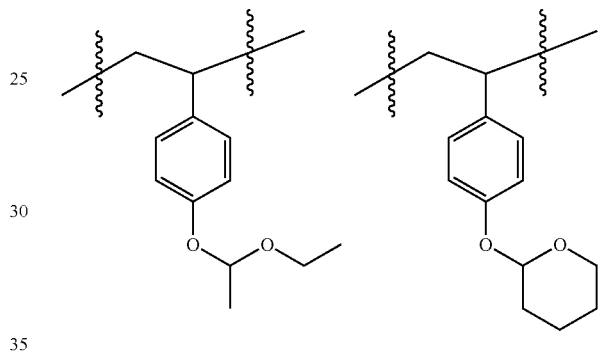

In one embodiment, the structure unit represented by Chemical Formula d-2 may be any one selected from among the following structure units, but is not limited thereto.

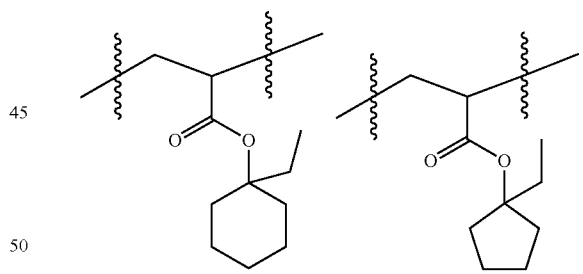

In one embodiment, the polymer(B) has a weight average molecular weight of greater than or equal to 3,000 g/mol and less than or equal to 15,000 g/mol; greater than or equal to 3,500 g/mol and less than or equal to 10,000 g/mol; or greater than or equal to 4,000 g/mol and less than or equal to 7,000 g/mol. When the weight average molecular weight of the polymer(B) is less than the above-mentioned range, cracks may occur on the formed photosensitive film, and when the weight average molecular weight is greater than the above-mentioned range, sensitivity decreases causing a foot occurrence.

In one embodiment, the photosensitive composition may further include an acid diffusion inhibitor.

As the acid diffusion inhibitor, compounds capable of suppressing a diffusion rate of acid generated from the polymer(A) are suited, and in one embodiment, basic compounds may be used as the acid diffusion inhibitor. By mixing with the acid diffusion inhibitor, an acid diffusion rate in the photosensitive film is suppressed, resulting in enhancing resolution, and an exposure margin, a pattern profile or the like may be enhanced by suppressing changes in the sensitivity after the exposure or decreasing substrate or environment dependence.

In one embodiment of the present specification, the acid diffusion inhibitor may include one, two or more types selected from the group consisting of aliphatic, aromatic or heterocyclic amines; nitrogen-containing compounds including a carboxyl group, a sulfonyl group, a hydroxyl group or a carbamate group; amide derivatives; and imide derivatives, but is not limited thereto.

The aliphatic amine may be a mono-, di- or tri-aliphatic amine. The aliphatic amine may be ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, tetraethylenepentamine, dimethylamine, diethylamine, methylenediamine, ethylenediamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, N,N-dimethylmethylenediamine, N,N-dimethylethylenediamine, N,N-dimethyltetraethylenepentamine, trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine or the like, but is not limited thereto.

Specific examples of the aromatic amine and heterocyclic amine may include aniline derivatives such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine; diphenyl(p-tolyl)amine; methyldiphenylamine; triphenylamine; phenylenediamine; naphthylamine; diaminonaphthalene; pyrrole derivatives such as pyrrole, 1-methylpyrrole, 2,4-dimethylpyrrole, 2,5-dimethylpyrrole and N-methylpyrrole; oxazole derivatives such as oxazole and isoxazole; thiazole derivatives such as thiazole and isothiazole; imidazole derivatives such as imidazole, 4-methylimidazole and 4-methyl-2-phenylimidazole; pyrazole derivatives; furazan derivatives; pyrroline derivatives such as pyrroline and 2-methyl-1-pyrroline; pyrrolidine derivative such as pyrrolidine, N-methylpyrrolidine, pyrrolidinone and N-methylpyrrolidone; imidazoline derivatives; imidazolidine derivatives; pyridine derivatives such as pyridine, methylpyridine, ethylpyridine, propylpyridine, butylpyridine, (1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 1-methyl-4-phenylpyridine, 2-(1-ethylpropyl)pyridine, aminopyridine and dimethylaminopyridine; pyridazine derivatives; pyrimidine derivatives; pyrazine derivatives; pyrazoline derivatives; pyrazolidine derivatives; piperidine derivatives; piperazine derivatives; morpholine derivatives; indole derivatives; isoindole derivatives; 1H-indazole derivatives; indoline derivatives; quinoline derivatives such as quinoline and 3-quinolinecarbonitrile; isoquinoline derivatives; cinnoline derivatives; quinazoline derivatives; quinoxaline derivatives; phthalazine derivatives; purine derivatives; pteridine derivatives; carbazole derivatives; phenanthridine derivatives; acridine derivatives; phenazine derivatives; 1,10-phenanthroline derivatives; adenine derivatives; adenosine derivatives; guanine derivatives; guanosine derivatives; uracil derivatives; uridine derivatives and the like.

The nitrogen-containing compound having a carboxyl group may include aminobenzoic acid, indolecarboxylic acid, amino acid derivatives (for example, nicotinic acid, alanine, arginine, aspartic acid, glutamic acid, glycine, histidine, isoleucine, glycyleucine, leucine, methionine, phenylalanine, threonine, lysine, 3-aminopyrazine-2-carboxylic acid, methoxyalanine) and the like.

The nitrogen-containing compound having a sulfonyl group may include 3-pyridinesulfonic acid, p-toluenesulfonic acid pyridinium and the like.

As the nitrogen-containing compound having a hydroxyl group, examples of a nitrogen-containing compound having a hydroxyphenyl group, and an alcoholic nitrogen-containing compound may include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl] piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyurolidine, 3-quinuclidinol, 3-tropanol, 1-methyl-2-pyrrolidineethanol, 1-aziridineethanol, N-(2-hydroxyethyl)phthalimide, N-(2-hydroxyethyl)isonicotinamide and the like.

The amide derivative may include formamide, N-methylformamide, N,N-dimethylformamide, acetamide, N-methylacetamide, N,N-dimethylacetamide, N,N-diethylacetamide, propionamide, benzamide, N,N-bis(2-hydroxyethyl)pivalamide, tetrabutylmalonamide and the like.

The imide derivative may include phthalimide, succinimide, maleimide and the like.

In one embodiment, the acid diffusion inhibitor is tert-pentyl-4-hydroxypiperidine-1-carboxylate.

In one embodiment, the acid diffusion inhibitor is included in the photosensitive composition in 0.1 parts by weight to 2 parts by weight; and preferably in 0.1 parts by weight to 1 parts by weight with respect to 100 parts by weight of the polymer(A).

In one embodiment, the photosensitive composition further includes a solvent.

Specifically, as the solvent, those selected from the group consisting of γ-butyrolactone, 1,3-dimethylimidazolidinone, methyl ethyl ketone, cyclohexanone, cyclopentanone, 4-hydroxy-4-methyl-2-pentanone, toluene, xylene, tetramethylbenzene, ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, triethylene glycol monoethyl ether, ethyl acetate, butyl acetate, ethylene glycol monoethyl ether acetate, ethylene glycol monobutyl ether acetate, diethylene glycol monoethyl ether acetate, dipropylene glycol monomethyl ether acetate, ethanol, propanol, ethylene glycol, propylene glycol, carbitol, N,N-diethylacetamide, dimethylformamide (DMF), diethylformamide (DEF), N,N-dimethylacetamide (DMAc), N-methylpyrrolidone (NMP), N-ethylpyrrolidone (NEP), 1,3-dimethyl-2-imidazolidinone, N,N-dimethylmethoxyacetamide, dimethyl sulfoxide, pyridine, dimethylsulfone, hexamethylphosphoramide, tetramethylurea, N-methylcaprolactam, tetrahydrofuran, m-dioxane, P-dioxane, 1,2-dimethoxyethane, bis(2-methoxyethyl)ether, 1,2-bis(2-methoxyethoxy)ethane, bis[2-(2-methoxyethoxy)]ether and mixtures thereof may be used.

In one embodiment, the photosensitive composition may further include one or more types of additives selected from the group consisting of a dissolution rate regulator, a sensitizer, an adhesive strength enhancer, a plasticizer, a filler, a leveling agent and a surfactant.

The additive may be used in a range of 0.1 parts by weight to 10 parts by weight with respect to 100 parts by weight of the polymer(A).

Specifically, as the adhesive strength enhancer, vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxysilane, 3-aminopropyltriethoxysilane, 3-glycidoxypropyltriethoxysilane, 3-glycidoxypropylmethyldimethoxysilane, 2-(3,4-ethoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane or the like may be used, and these may be used either alone in one type, or as a mixture of two or more types.

As the surfactant, those usable in a photosensitive composition may be used without particularly limit, and among those, fluorine-based surfactants or silicone-based surfactants may be preferably used.

In one embodiment, the polymer(A) may be formed by polymerizing a norbornene derivative including M1 and M2 and a norbornene derivative not including M1 and M2. However, the formation is not limited thereto, and the polymer(A) may also be formed by polymerizing a norbornene derivative not including M1 and M2 to form a polymer having the main chain formed with a norbornane ring, and then reacting the polymer with a compound including M1 and M2.

One embodiment of the present specification provides a pattern formed using the 2.5 photosensitive composition. In one embodiment, the pattern includes the polymer(A) or a cured material thereof.

In one embodiment, a method for forming the pattern using the photosensitive composition includes (1) forming a photosensitive film on a substrate using the photosensitive composition; (2) selectively exposing the photosensitive film; and (3) developing the exposed photosensitive film.

The (1) forming of a photosensitive film includes coating a photosensitive composition on a substrate; and drying (soft baking) the coated material.

In one embodiment, as the method of coating the photosensitive composition, a method of coating with a spin coater, a bar coater, a blade coater, a curtain coater, a screen printer or the like, a method of spraying with a spray coater, or the like may be used, however methods capable of coating a photosensitive composition may be used without limit.

In the drying (soft baking) of the coated material, the coated material may be dried under a condition of 1 second to 10 minutes at 90° C. to 120° C. Examples of the drying method may include an oven, a hot plate, vacuum drying and the like, but are not limited thereto. When going through the drying, a solvent is removed from the photosensitive composition increasing adhesive strength between the substrate and the photosensitive film.

The (2) selectively exposing of the photosensitive film is aligning a mask on a photoresist layer, and exposing an area of the photosensitive film not covered by the mask to light. The mask may be in contact with the photosensitive film, or may also be aligned at a certain distance from the photosensitive film. In the exposure process, a light source irradiated as a light irradiation means may include electromagnetic waves, from ultraviolet rays to visible rays, an electron beam, X-rays, laser rays and the like. In addition, as a method of irradiating the light source, known means such as a high pressure mercury lamp, a xenon lamp, a carbon arc lamp, a halogen lamp, a cold cathode tube for a copier, an LED and a semiconductor laser may be used.

The (2) selectively exposing of the photosensitive film may further include heating (post-exposure baking) the exposed photosensitive film after the exposure. By heating the exposed photosensitive film, components in the photosensitive composition are realigned, reducing a standing wave of the photosensitive film. In addition, the heating (post-exposure baking) helps with diffusion of the acid generated during the exposure, and facilitates deprotecting the acid-labile group included in the polymer(B).

The heating (post-exposure baking) of the photosensitive film may be conducted under a condition of 1 second to 10 minutes at 110° C. to 130° C., however, the condition is not limited as long as it is higher than a temperature drying (soft baking) the coated material.

In one embodiment, when the amount of exposure capable of forming a 32 nm line pattern after forming a photosensitive film having a thickness of 56 nm by coating the photosensitive composition on a silicone substrate and heating the result for 60 seconds at 120° C. on a hot plate, exposing the result under ArF ultraviolet rays using a photomask (pattern width 16 nm), heating the exposed substrate for 90 seconds at 110° C., and developing the result in a 2.38 wt % tetramethylammonium hydroxide (TMAH) solution is employed as optimum exposure (Eop), the optimum exposure of the photosensitive composition is 75 mJ/cm$^2$ or less; 73 mJ/cm$^2$ or less; or 70 mJ/cm$^2$ or less.

The (3) developing of the exposed photosensitive film is removing an unexposed portion in the photosensitive film by immersing in a developing solution. As the developing method, photosensitive film developing methods known in the art such as a rotary spray method, a paddle method, an immersion method accompanying ultrasonic treatment may be used, however, the method is not limited thereto.

Examples of the developing solution may include alkali metal or alkaline earth metal hydroxides, carbonates, hydrogen carbonates, an aqueous basic solution such as an ammonia water quaternary ammonium salt may be used. Among these, an aqueous ammonia quaternary ammonium solution such as an aqueous tetramethyl ammonium solution is particularly preferred.

The (3) developing of the exposed photosensitive film may further include, after developing the exposed photosensitive film, drying the developed pattern. The pattern may be formed by drying under the air or nitrogen atmosphere after the developing.

The (3) developing of the exposed photosensitive film may further include, after the drying of the pattern, heating (post baking) the pattern. This step may be further conducted in order to increase adhesive strength and etching resistance of the semiconductor substrate and the photosensitive film. The heating may be conducted under a condition of 1 second to 30 minutes at 120° C. to 150° C. using an oven, a hot plate or the like. When it is necessary to significantly increase etching resistance of the photosensitive film, the photosensitive film may be heated (deep UV hardened) for 1 second to 30 minutes while irradiating deep UV at a high temperature of 120° C. to 190° C.

In one embodiment, the pattern has a thickness of 100 nm or less.

In one embodiment, the photosensitive composition may be used in forming a micropattern of less than 10 nm using extreme ultraviolet rays (EUV) or an electron beam (E-beam) as a light source.

In one embodiment, the pattern type may be a line type.

In one embodiment, the line width roughness of the pattern obtained when coating the photosensitive composition on a silicone substrate, forming a thin film by baking (soft baking) the result for 60 seconds at 120° C., exposing the result under ArF ultraviolet rays using a photomask (pattern width 16 nm), then baking (post exposure baking) the result for 90 seconds at a temperature of 110° C., and developing the result in a 2.38 wt % tetramethylammonium hydroxide (TMAH) solution is 10.5 nm or less; or 10.2 nm or less.

In one embodiment, when the photosensitive composition does not include a separate photoacid generator, the line width roughness may be 9 nm or less; 8.7 nm or less; 8.4 nm or less; or 8.2 nm or less.

The photosensitive composition according to one embodiment of the present specification may be used in all lithography processes requiring a micropattern, and may be used in manufacturing devices for a semiconductor or all other electronic devices. In one embodiment, the photosensitive composition may be used in an EUV lithography process.

In one embodiment of the present disclosure, the method for forming a pattern of a photoresist layer may be used in a semiconductor circuit manufacturing process. In one embodiment, the semiconductor circuit manufacturing process may be conducted by further including, in the above-described pattern-forming process, (4) etching an area of a semiconductor substrate not covered by the photoresist layer, and removing (ashing) the photoresist layer from the semiconductor substrate.

The (4) etching of an area of a substrate not covered by the photosensitive film is etching a substrate area other than the pattern of the photosensitive film. In one embodiment, the substrate may be a semiconductor substrate. The removing of the photosensitive film from the substrate may use known methods, and for example, may be conducted by heating a wafer in a low pressure state using a reaction chamber, and then injecting a plasma including an oxygen group or an oxygen ion thereto.

In one embodiment, the photosensitive composition is a photosensitive composition for manufacturing a semiconductor circuit. In one embodiment, a circuit pattern may be formed on a semiconductor such as a silicon wafer using the photosensitive composition.

In addition thereto, the photosensitive composition, the photoresist layer or the photoresist pattern may be used in fields such as devices used in a semiconductor post-process without limit.

Examples according to the present disclosure are for describing the present disclosure in more detail, and may be modified to various different forms other than the descriptions to provide below, and the scope of a right of the present disclosure is not limited to the examples described below.

Synthesis Example 1 (Preparation of Compounds a1, a2, b1 and b2)

Preparation of Compound a1

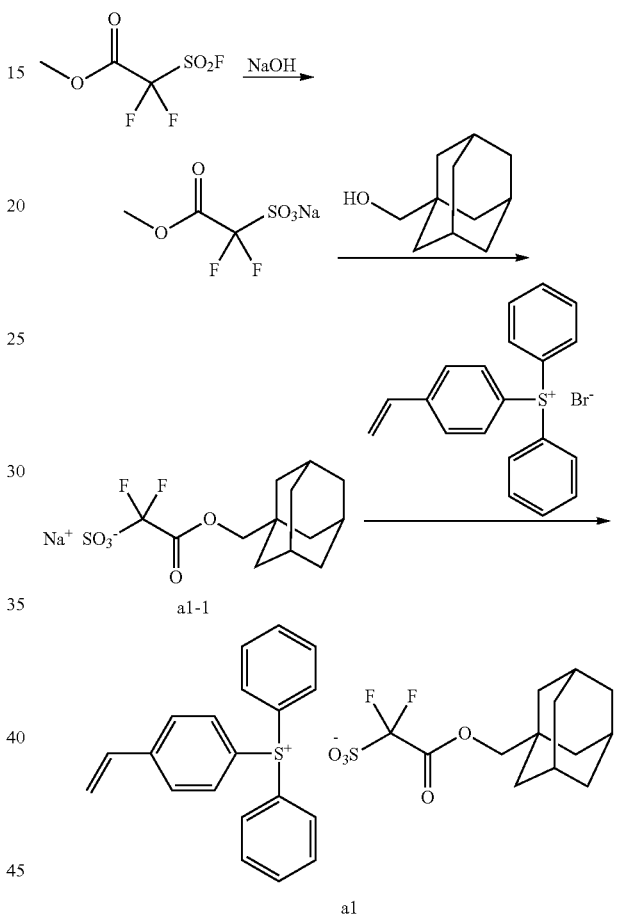

A solution obtained by dissolving methyl 2,2-difluoro-2-(fluorosulfonyl)acetate (57.6 g, 0.3 mol) in water (57.6 g) was cooled to 0° C., and a 50% sodium hydroxide (NaOH) solution (28 g) was slowly dropped thereto. The solution was heated to 100° C. for 3 hours, and when the reaction was finished, the result was cooled to room temperature. The result was neutralized using 37% hydrochloric acid (34.5 g), and concentrated to obtain sodium 1,1-difluoro-2-methoxy-2-oxoethanesulfonate.

After dissolving sodium 1,1-difluoro-2-methoxy-2-oxo-ethanesulfonate (42.4 g, 0.2 mol), 1-adamantylmethanol (41.5 g, 0.25 mol) and p-toluenesulfonic acid (p-TsOH) (51.6 g, 0.3 mol) in dichloroethane (140 g), the result was heated to 85° C. for 4 hours. The mixture solution was concentrated to remove dichloroethane, washed with t-butyl methyl ether (280 g), and then filtered. Acetonitrile (100 g) was added to obtained solids, and the result is stirred and then filtered. The filtrate was concentrated to obtain Intermediate a1-1.

After dissolving Intermediate a1-1 (34.6 g, 0.1 mol) in acetonitrile (170 g), diphenyl(4-vinylphenyl)sulfonium bromide (40.48 g, 0.11 mol) and water (200 g) were added thereto, and the result was stirred for 15 hours. The concentrated solution was washed with t-butyl methyl ether, and filtered to obtain Compound a1 in a white solid form. Nuclear magnetic resonance (NMR) data for Compound a1 are as follows.

$^1$H-NMR (500 MHz, DMSO-D$_6$): (ppm) 1.7 (m, 15H), 1.8 (m, 3H), 3.94 (s, 2H), 5.25 (d, 1H), 5.76 (d, 1H), 6.72 (q, 1H), 7.36 (m, 14H)

Preparation of Compound a2

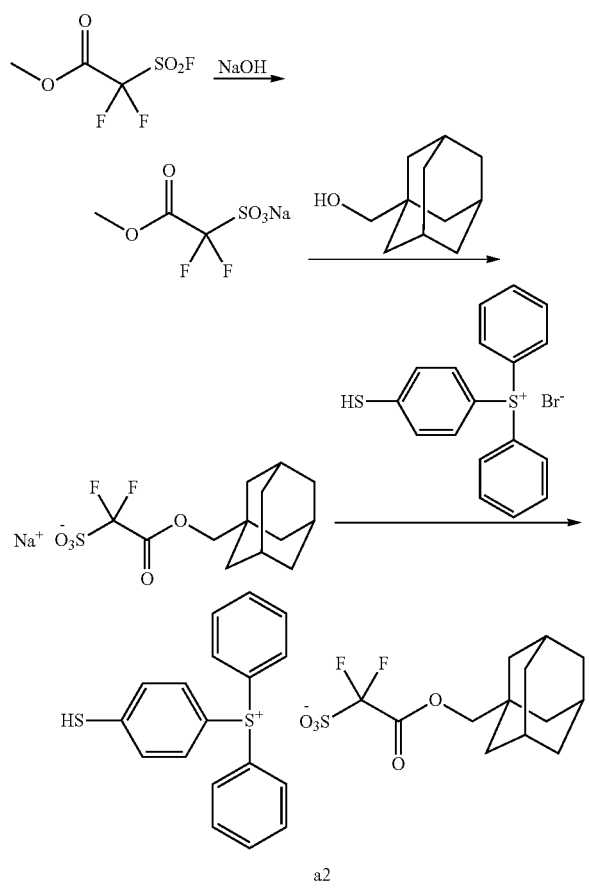

a2

Compound a2 was prepared in the same manner as in the method for preparing Compound a1 except that (4-mercaptophenyl)diphenylsulfonium bromide was used instead of diphenyl(4-vinylphenyl)sulfonium bromide. Nuclear magnetic resonance (NMR) data for Compound a2 are as follows.

$^1$H-NMR (500 MHz, DMSO-D$_6$): (ppm) 1.76 (m, 15H), 1.87 (m, 3H), 3.4 (s, 1H), 3.9 (s, 2H), 7.17 (d, 2H), 7.35 (m, 12H)

Preparation of Compound a3

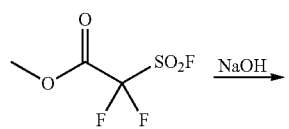

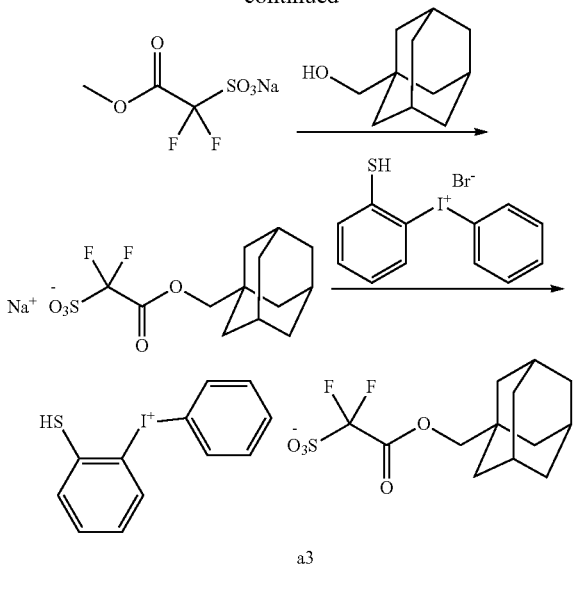

a3

Compound a3 was prepared in the same manner as in the method for preparing Compound a1 except that (2-mercaptophenyl)phenyliodinium bromide was used instead of diphenyl(4-vinylphenyl)sulfonium bromide. Nuclear magnetic resonance (NMR) data for Compound a3 are as follows.

$^1$H-NMR (500 MHz, DMSO-D$_6$): (ppm) 1.76 (m, 15H), 1.87 (m, 3H), 3.9 (s, 2H), 4.0 (s, 1H), 7.25 (m, 3H), 7.45 (m, 2H), 8.25 (d, 3H)

Preparation of Compound b1

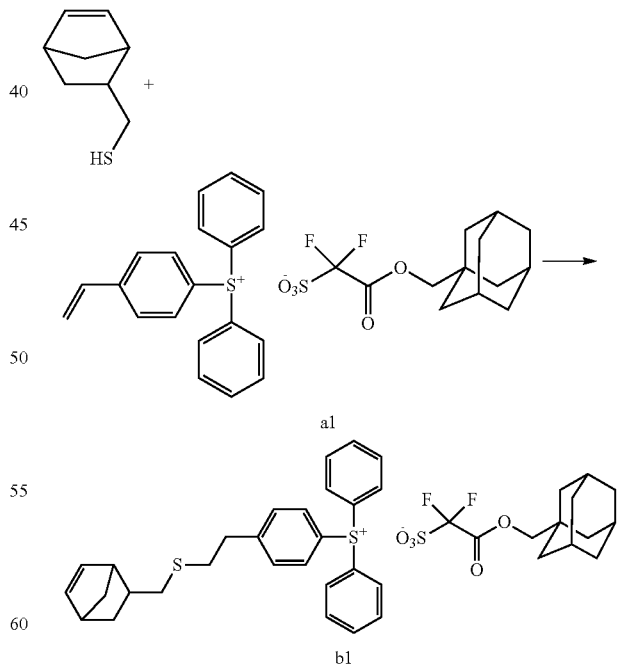

b1

Compound a1 (62.2 g, 0.1 mol), azobisisobutyronitrile (0.068 g, 0.4 mmol) and bicyclo[2.2.1]-5-hepten-2-ylmethanethiol (12.6 g, 0.09 mol) were dissolved in propylene glycol methyl ether acetate (73.9 g) (solid concentration 50 wt %). The result was heated to 65° C. to progress the reaction for 1 hour, and after further introducing the solvent (73.9 g) thereto, the result was washed several times with water. Water was removed using magnesium sulfate, and the result was concentrated to obtain Compound b1. Nuclear magnetic resonance (NMR) data for Compound b1 are as follows. Finish of the reaction was identified by identifying that 3H of the ethylene group between 5 ppm to 7 ppm disappeared in the $^1$H-NMR.

$^1$H-NMR (500 MHz, DMSO-D$_6$): (ppm) 1.31 (m, 1H), 1.56 (m, 1H), 1.7~1.87 (m, 21H), 2.35 (m, 3H), 2.84 (m, 5H), 3.94 (s, 2H), 6.05 (m, 2H), 7.2 (d, 2H), 7.35 (m, 12H)

Preparation of Compound b2

Preparation of Compound b3

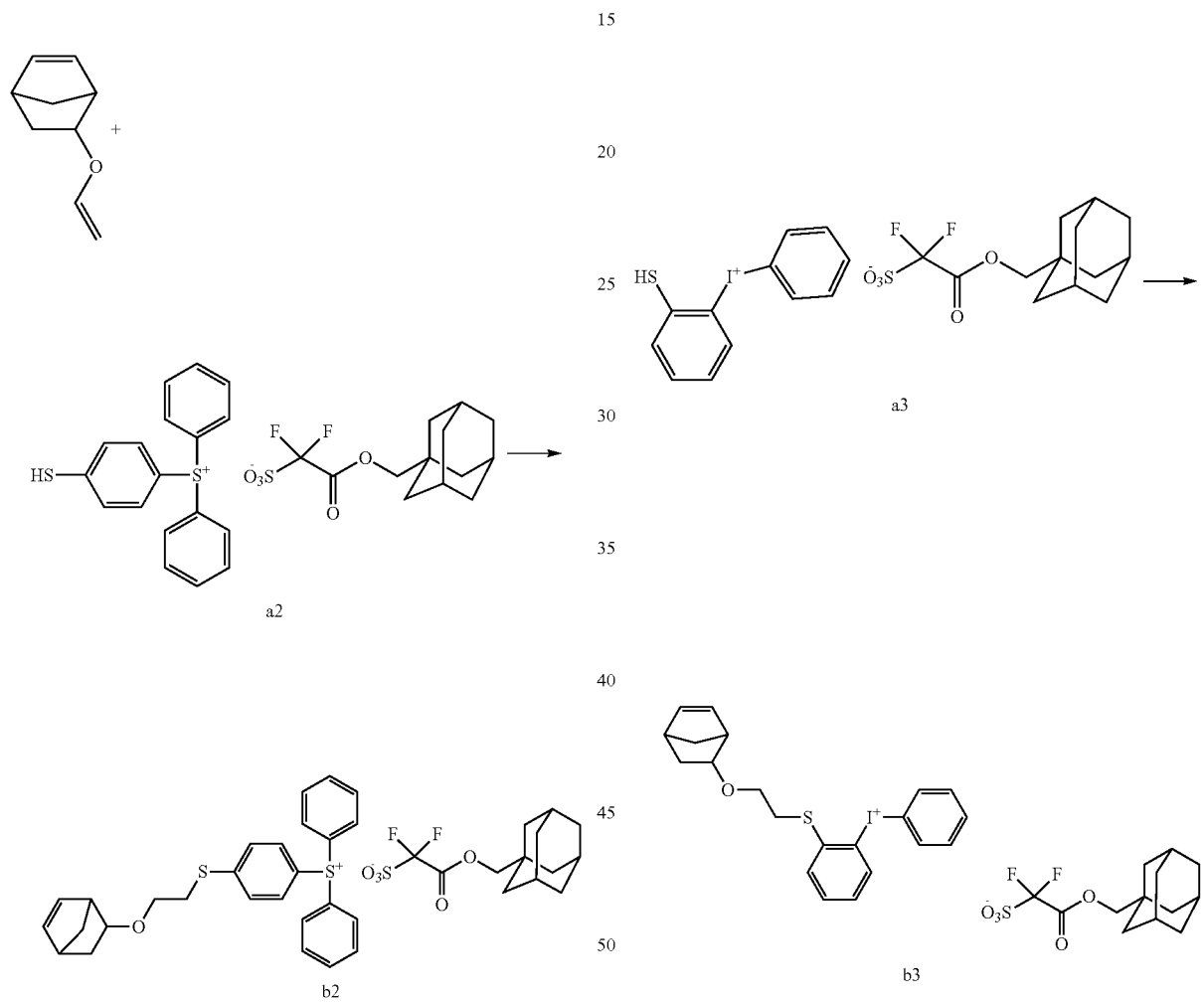

Compound b2 was prepared in the same manner as in the method for preparing Compound b1 except that 5-(vinyloxy)bicyclo[2.2.1]-2-heptene was used instead of bicyclo[2.2.1]-5-hepten-2-ylmethanethiol, and Compound a2 was used instead of Compound a1. Nuclear magnetic resonance (NMR) data for Compound b2 are as follows. Finish of the reaction was identified by identifying that 3H of the ethylene group between 4.4 ppm to 16 ppm and at 6.45 ppm disappeared in the $^1$H-NMR.

$^1$H-NMR (500 MHz, DMSO-D$_6$): (ppm) 1.51 (m, 4H), 1.7~1.87 (m, 15H), 2.38 (m, 1H), 2.84 (m, 1H), 2.96 (m, 2H), 3.34 (m, 1H), 3.77 (m, 2H), 5.98 (m, 1H), 6.23 (m, 1H), 7.33 (d, 2H), 7.35 (m, 12H)

Compound b3 was prepared in the same manner as in the method for preparing Compound b1 except that 5-(vinyloxy)bicyclo[2.2.1]-2-heptene was used instead of bicyclo[2.2.1]-5-hepten-2-ylmethanethiol, and Compound a3 was used instead of Compound a1. Nuclear magnetic resonance (NMR) data for Compound b3 are as follows. Finish of the reaction was identified by identifying that 3H of the ethylene group between 4.4 ppm to 16 ppm and at 6.45 ppm disappeared in the $^1$H-NMR.

$^1$H-NMR (500 MHz, DMSO-D6): (ppm) 1.51 (m, 4H), 1.7~1.87 (m, 15H), 2.38 (m, 1H), 2.84 (m, 1H), 2.96 (m, 2H), 3.34 (m, 1H), 3.77 (m, 2H), 5.98 (m, 1H), 6.23 (m, 1H), 7.25 (m, 3H), 7.45 (m, 2H), 8.25 (d, 3H)

Synthesis Example 2 (Preparation of Compounds A1 to A4)

Preparation of Compound A1

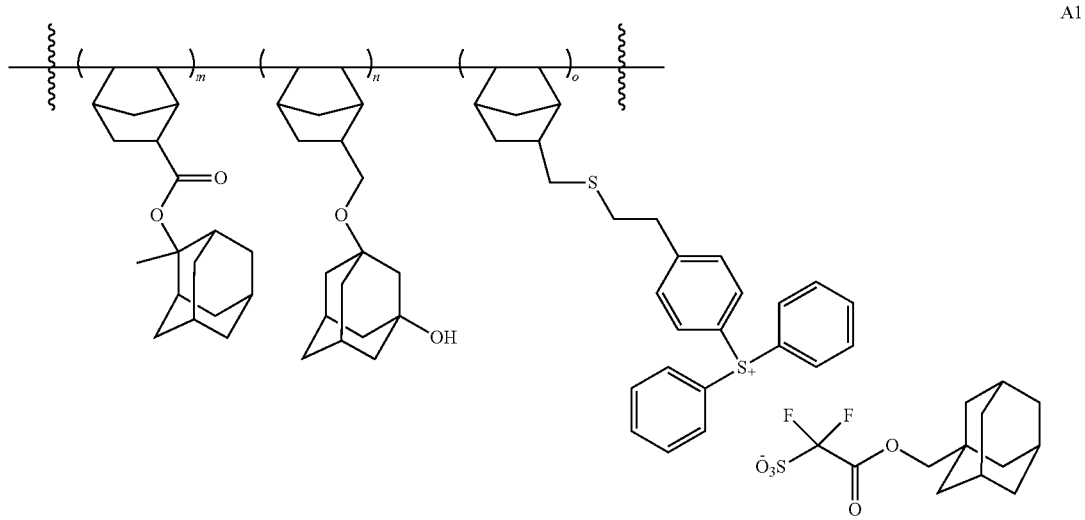

A1

In a reaction flask, 2-methyladamantan-2-yl bicyclo[2.2.1]-5-heptene-2-carboxylate (17.2 g, 0.06 mol), 3-hydroxyadamantan-1-ylbicyclo[2.2.1]-5-heptene-2-carboxylate (8.6 g, 0.03 mol) and Compound b1 (7.5 g, 0.01 mol) were introduced to anisole so as to have a solid concentration of 33.3 wt %, and the result was stirred for 20 minutes under the nitrogen atmosphere. A palladium metal catalyst was dissolved in anisole under the argon atmosphere to prepare a palladium catalyst solution. After heating the reaction solution to 65° C., the palladium catalyst solution was injected to the reaction solution using a syringe, and the result was stirred for 18 hours. After the reaction was finished, the reaction solution was diluted with anisole, and precipitated by adding an excess amount of hexane thereto. Obtained solids were filtered, and dried for 18 hours in a 40° C. oven to obtain Compound A1. A weight average molecular weight of Compound A1 measured using gel permeation chromatography (GPC) was 4,700 g/mol. (m:n:o=6:3:1)

Preparation of Compound A2

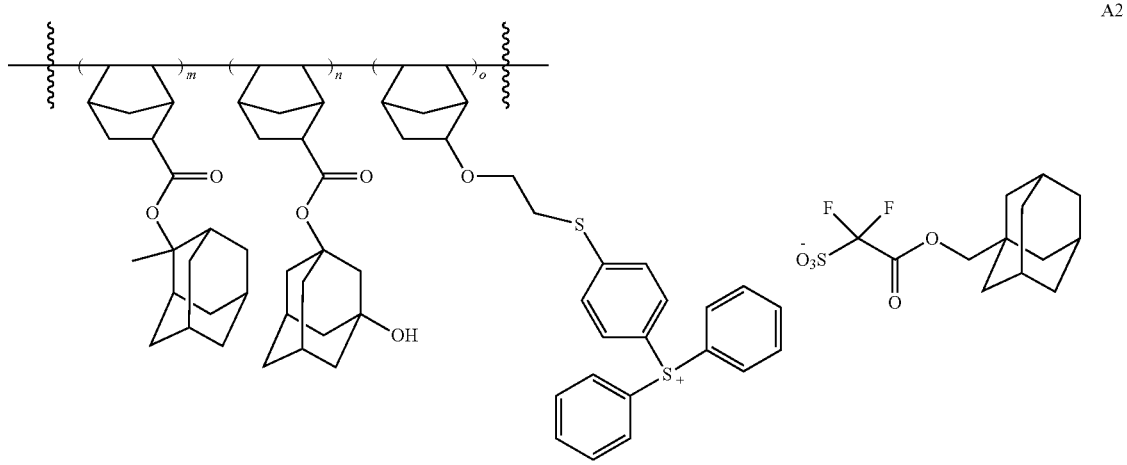

A2

Compound A2 was prepared in the same manner as in the preparation of Compound A1 except that Compound b2 was used instead of Compound b1. A weight average molecular weight of Compound A2 measured using gel permeation chromatography (GPC) was 4,500 g/mol.

Preparation of Compound A3

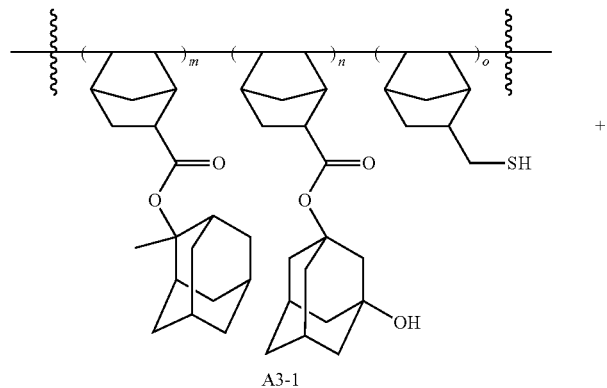

A3-1

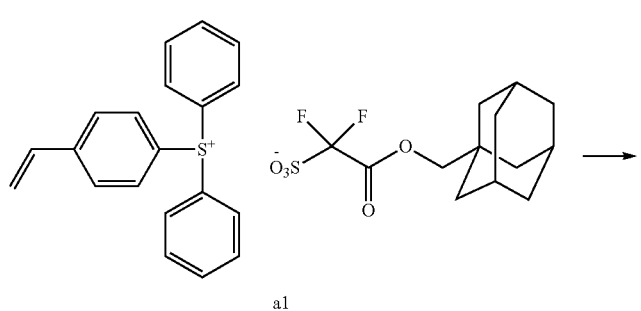

a1

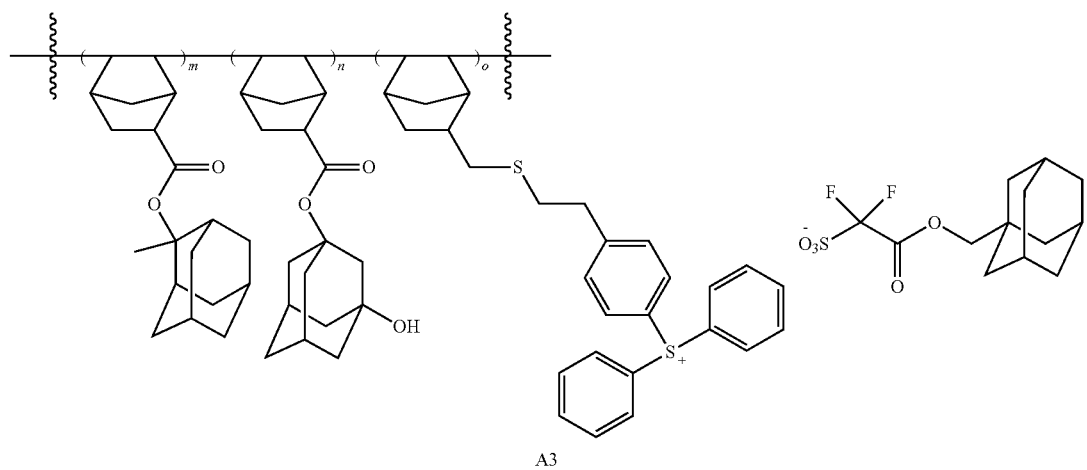

A3

Compound A3-1 was prepared in the same manner as in the preparation of Compound A1 except that bicyclo[2.2.1]-5-hepten-2-ylmethanethiol was used instead of Compound b1. Compound A3-1 (23.6 g) obtained in a solid form, Compound a1 (1.4 g) and azobisisobutyronitrile (0.017 g, 0.1 mmol) were dissolved in propylene glycol methyl ether acetate (25 g) (solid concentration 50 wt %). The result was heated to 65° C. to progress the reaction for 1 hour, and after further introducing the solvent (25 g) thereto, the result was washed several times with water. Water was removed using magnesium sulfate, and the result was concentrated to obtain Compound A3. A weight average molecular weight of Compound A3 measured using gel permeation chromatography (GPC) was 4,300 g/mol.

Preparation of Compound A4

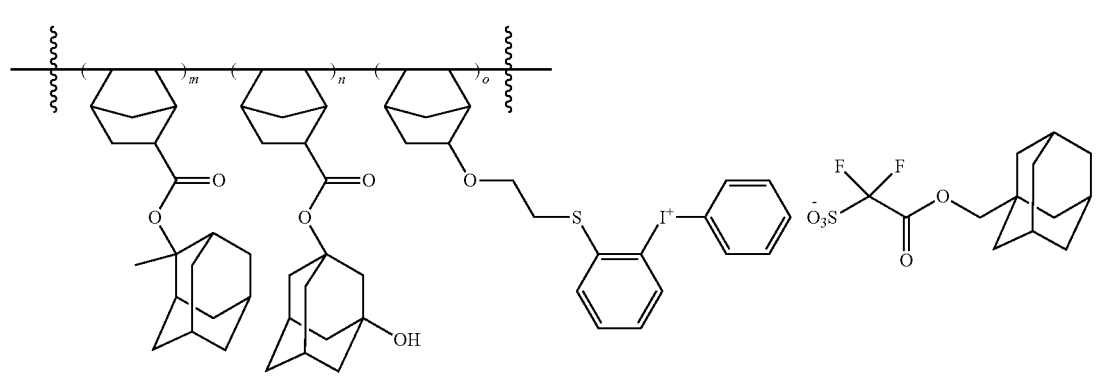

Compound A4 was prepared in the same manner as in the preparation of Compound A1 except that Compound b3 was used instead of Compound b1. A weight average molecular weight of Compound A4 measured using gel permeation chromatography (GPC) was 4,400 g/mol.

Synthesis Example 3 (Preparation of Compounds R1 and R2)

Preparation of Compound R1

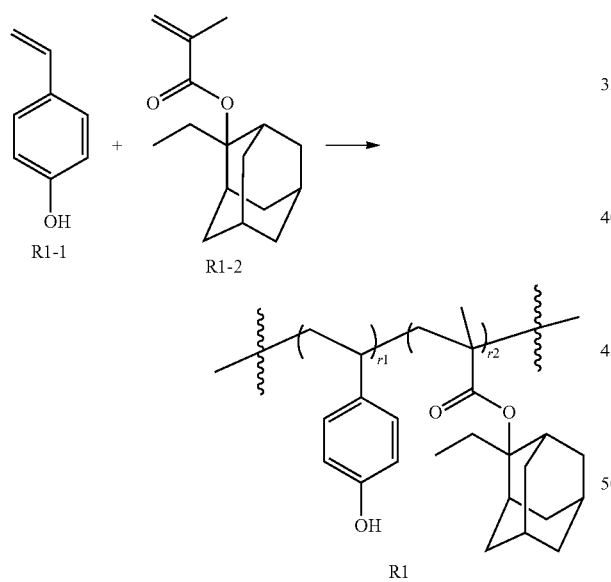

In a reaction flask, Compound R1-1 (42 g, 0.35 mol) and Compound R1-2 (37.2 g, 0.15 mol) were introduced to tetrahydrofuran (79.2 g), and the result was stirred for 20 minutes under the nitrogen atmosphere. Azobisisobutyronitrile (0.48 g) was dissolved in tetrahydrofuran (2 g) to prepare an initiator solution. After heating the reaction solution to 65° C., the initiator solution was introduced thereto, and the result was stirred for 18 hours. After the reaction was finished, the reaction solution was diluted with tetrahydrofuran, and precipitated by adding an excess amount of hexane thereto. Obtained solids were filtered, and dried for 18 hours in a 30° C. oven to obtain Compound R1.

A weight average molecular weight of Compound R1 measured using gel permeation chromatography (GPC) was 6,700 g/mol. (r1:r2=7:3)

Preparation of Compound R2

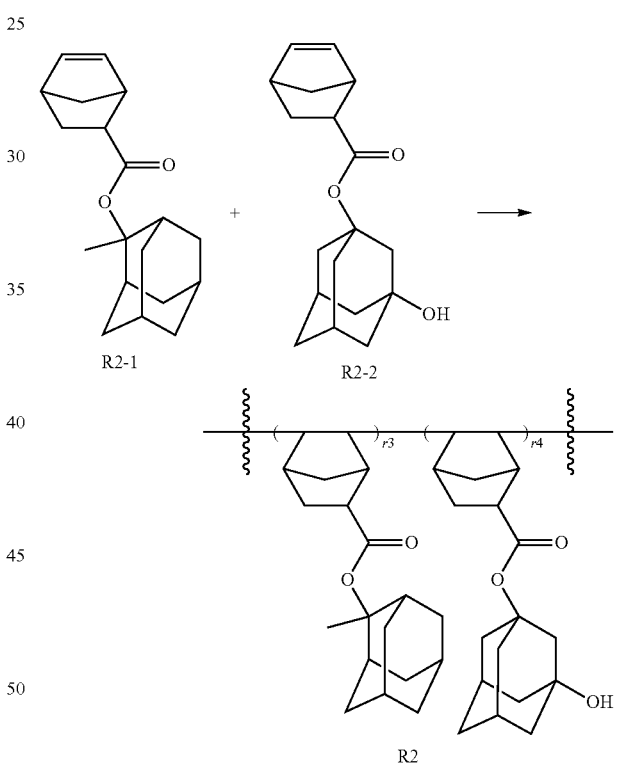

In a reaction flask, Compound R2-1 (42.9 g, 0.15 mol) and Compound R2-2 (28.8 g, 0.1 mol) were introduced to anisole (71.7 g), and the result was stirred for 20 minutes under the nitrogen atmosphere. A palladium metal catalyst was dissolved in anisole under the argon atmosphere to prepare a palladium catalyst solution. After heating the reaction solution to 65° C., the palladium catalyst solution was injected to the reaction solution using a syringe, and the result was stirred for 18 hours. After the reaction was finished, the reaction solution was diluted with anisole, and precipitated by adding an excess amount of hexane thereto. Obtained solids were filtered, and dried for 18 hours in a 40° C. oven to obtain Compound R2. A weight average molecular weight of Compound R2 measured using gel permeation chromatography (GPC) was 4,300 g/mol. (r3:r4=6:4)

Example 1

100 parts by weight of a resin obtained by mixing Compound R1 and Compound A1 in a weight ratio of 40:60 and 1 parts by weight of N-tert-amyloxycarbonyl-4-hydroxypiperidine (acid diffusion inhibitor) were introduced to propylene glycol methyl ether acetate to prepare a mixture solution having a solid concentration of 4% by weight. The mixture solution was filtered using a 0.2 μm filter to prepare a photosensitive composition. After forming an anti-reflective film on a silicon wafer, the photosensitive composition was spin coated. The result was baked (SOB) for 60 seconds at 120° C. using a hot plate to form a photoresist layer.

Patterning was conducted by irradiating ArF ultraviolet rays on the photoresist layer. For acid diffusion, the result was baked (PEB) for 90 seconds at 110° C., and developed for 60 seconds using a 2.38 wt % aqueous tetramethylammonium hydroxide (TMAH) solution. The prepared pattern thickness was measured using a scanning electron microscope (SEM), and the thickness was 56 nm.

Example 2

A photoresist pattern was formed in the same manner as in Example 1 except that Compound A2 was used instead of Compound A1.

Example 3

A photoresist pattern was formed in the same manner as in Example 1 except that Compound A3 was used instead of Compound A1.

Comparative Example 1

A photoresist pattern was formed in the same manner as in Example 1 except that Compound R2 was used instead of Compound A1, and 6 parts by weight of the following Compound D1 with respect to 100 parts by weight of the resin was further used in the mixture solution.

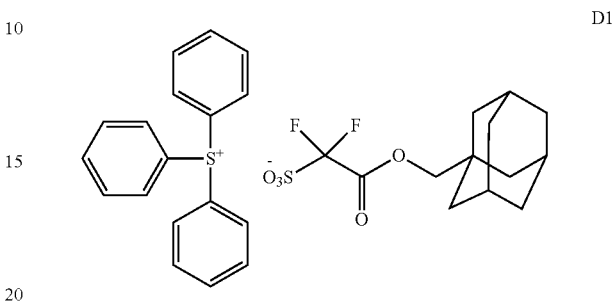

D1

Comparative Example 2

A photoresist pattern was formed in the same manner as in Comparative Example 1 except that Compound D1 was used in 8 parts by weight with respect to 100 parts by weight of the resin.

Comparative Example 3

A photoresist pattern was formed in the same manner as in Example 1 except that Compound A5 was used instead of Compound A1. (m:n:o=6:3:1)

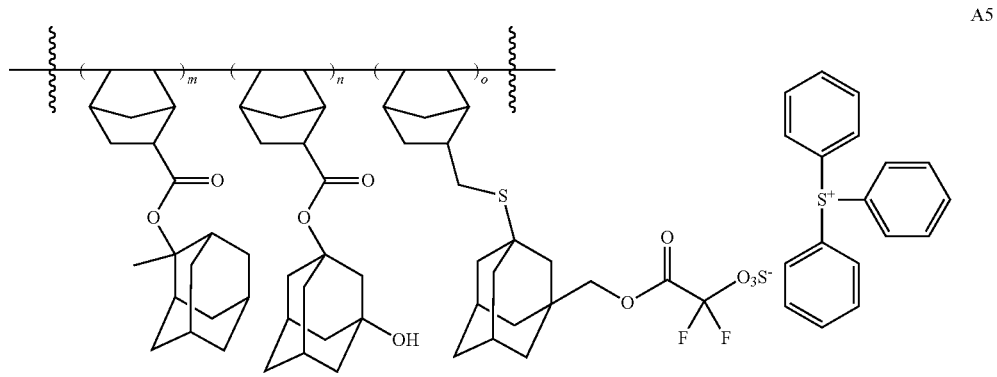

A5

Comparative Example 4

A photoresist pattern was formed in the same manner as in Example 1 except that Compound A6 was used instead of Compound A1. (m:n:o=6:3:1)

A6

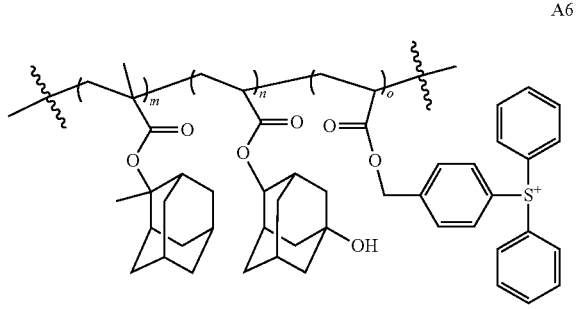

scanning electron microscope (SEM) to identify a line width roughness (LWR) value. A smaller LWR value means a uniform pattern. In the LWR evaluation column, the LWR value of 9 nm or less was marked as ○, 11 nm or less as Δ, and greater than 11 nm as X.

Method for Measuring Dose

The exposure at which the line pattern formed using the above-described pattern forming method is 32 nm pitch was employed as optimum exposure (Eop, mJ/cm$^2$), and the optimum exposure was expressed as dose. Based on the 32 nm pitch, 70 mJ/cm$^2$ or less was marked as ○, 90 mJ/cm$^2$ or less as Δ, and greater than 90 mJ/cm$^2$ as X.

TABLE 1

|  | Resin (wt %) |  | PAG (% by Weight) | Dose (mJ/cm$^2$) | Dose Evaluation | LWR (nm) | LWR Evaluation |
| --- | --- | --- | --- | --- | --- | --- | --- |
| Example 1 | R1(40) | A1(60) | — | 67 | ○ | 7.9 | ○ |
| Example 2 | R1(40) | A2(60) | — | 62 | ○ | 8.1 | ○ |
| Example 3 | R1(40) | A3(60) | — | 65 | ○ | 7.1 | ○ |
| Example 4 | R1(40) | A1(60) | 2 | 61 | ○ | 10.1 | Δ |
| Example 5 | R1(40) | A4(60) | — | 70 | ○ | 8.5 | ○ |
| Comparative Example 1 | R1(40) | R2(60) | 6 | 98 | X | 12.2 | X |
| Comparative Example 2 | R1(40) | R2(60) | 8 | 78 | Δ | 11.3 | X |
| Comparative Example 3 | R1(40) | A5(60) | — | 68 | ○ | 11.5 | X |
| Comparative Example 4 | R1(40) | A6(60) | — | 58 | ○ | 12.5 | X |

-continued

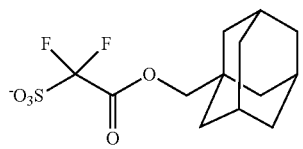

Example 4

A photoresist pattern was formed in the same manner as in Comparative Example 1 except that Compound A1 was used instead of Compound R2, and Compound D1 was used in 2 parts by weight with respect to 100 parts by weight of the resin.

Example 5

A photoresist pattern was formed in the same manner as in Example 1 except that Compound A4 was used instead of Compound A1.

For each of the photoresist patterns formed in Examples 1 to 5 and Comparative Examples 1 to 4, LWR and dose were measured using the following methods, and the results are shown in Table 1.

Method for Measuring LWR

A difference between the widest part and the narrowest part in the line width of the line was measured using a From Table 1, it was identified that, when using the polymer(A) of the present disclosure, optimum exposure of the photoresist pattern was superior compared to when using a compound not including a photoacid generator in the compound.

The invention claimed is:
1. A polymer (A) comprising:
a structure unit represented by Chemical Formula 1a; and
a structure unit represented by Chemical Formula 1c:

[Chemical Formula 1a]

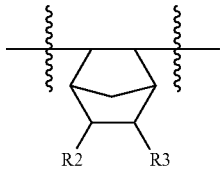

[Chemical Formula 1c]

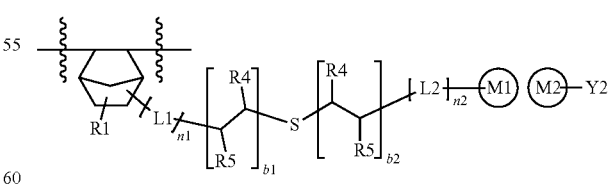

wherein, in the Chemical Formulae 1a and 1c,
M1 is an organic cation, and M2 is an organic anion;
L1 and L2 are the same as or different from each other, and each independently any one group selected from the first group consisting of a linear or branched alkylene group; a divalent saturated hydrocarbon ring group; a divalent aromatic hydrocarbon group; a divalent saturated heteroring group; a divalent aromatic heteroring group; a divalent ring group having at least two rings fused, each ring being selected from a saturated hydrocarbon ring, an aromatic hydrocarbon, a saturated heteroring and an aromatic heteroring; —O—; —C(=O)—; —C(=O)O—; —C(=O)N(R19)-; —N(R19)-; —S—; —S(=O)—; —S(=O)$_2$—; and —S(=O)$_2$O—, or a functional group linking two or more of the groups selected from the first group, and R19 is hydrogen; deuterium; an alkyl group; a saturated hydrocarbon ring group; or an aromatic hydrocarbon group, and two or more R19s are the same as or different from each other;

L1 and L2 are the same as or different from each other, and each independently optionally further substituted with deuterium; a halogen group; a hydroxyl group; an oxo group (=O); or an alkyl group;

n1 is an integer of 0 or greater, and when n1 is 2 or greater, L1s are the same as or different from each other;

n2 is an integer of 0 or greater, and when n2 is 2 or greater, L2s are the same as or different from each other;

Y2, R1, R2 and R3 are each independently any one group selected from the second group consisting of hydrogen; deuterium; a halogen group; a nitrile group; an alkyl group; a saturated hydrocarbon ring group; an aromatic hydrocarbon group; a saturated heteroring group; an aromatic heteroring group; a ring group having at least two rings fused, each ring being selected from a saturated hydrocarbon ring, an aromatic hydrocarbon, a saturated heteroring and an aromatic heteroring; —OR; —OC(=O)R; —C(=O)R; —C(=O)OR; —C(=O)NR$_2$; —NR$_2$; —SR; —S(=O)R; —S(=O)$_2$R; and —S(=O)$_2$OR, or a functional group linking two or more of the groups selected from the second group, and R is hydrogen; deuterium; an alkyl group; a saturated hydrocarbon ring group; an aromatic hydrocarbon group; a saturated heteroring group; an aromatic heteroring group; or a ring group having at least two or more rings fused, each ring being selected from a saturated hydrocarbon ring, an aromatic hydrocarbon, a saturated heteroring and an aromatic heteroring, two or more Rs being the same as or different from each other; and R1 to R3 and Y2 are the same as or different from each other and each independently optionally further substituted with deuterium; a halogen group; a hydroxyl group;

an oxo group (=O); or an alkyl group,

R4 and R5 are the same as or different from each other, and each independently have the same definition as R1; and b1 is 0 or 1, b2 is 0 or 1, and a sum of b1 and b2 is 1.

2. The polymer (A) of claim 1, wherein M1 is represented by any one functional group represented by Chemical Formulae a-1 to a-3:

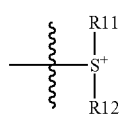
(a-1)

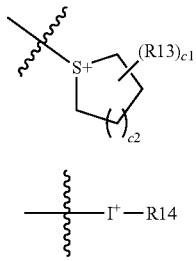

in the Chemical Formulae a-1 to a-3,

 represents a site linked to L2;

R11 to R14 are the same as or different from each other, and each independently hydrogen; a linear or branched alkyl group; a saturated hydrocarbon ring group; an aromatic hydrocarbon group; a saturated heteroring group; an aromatic heteroring group; or a ring group having two or more rings fused, each ring being selected from a saturated hydrocarbon ring, an aromatic hydrocarbon, a saturated heteroring and an aromatic heteroring, R11 to R14 being each independently optionally further substituted with deuterium; a halogen group; a hydroxyl group; an alkoxy group; an oxo group (=O); or an alkyl group;

c1 is an integer of 0 or greater, and when c1 is 2 or greater, R13s are the same as or different from each other; and c2 is an integer of 1 to 10.

3. The polymer (A) of claim 1, wherein M2-Y2 is represented by Chemical Formula 10:

[Chemical Formula 10]

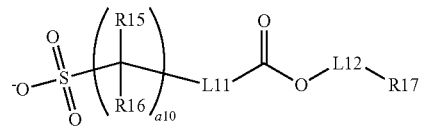

in the Chemical Formula 10,

R15 and R16 are the same as or different from each other and each independently a halogen group;

a10 is an integer of 1 to 5, and when a10 is 2 or greater, the two or more R15s and R16s are each the same as or different from each other;

L11 and L12 are the same as or different from each other, and each independently any one group selected from the third group consisting of a single bond; a linear or branched alkylene group; a divalent saturated hydrocarbon ring group; a divalent aromatic hydrocarbon group; a divalent saturated heteroring group; a divalent aromatic heteroring group; a divalent ring group having two or more rings fused, each ring selected from a saturated hydrocarbon ring, an aromatic hydrocarbon, a saturated heteroring and an aromatic heteroring; —O—; —C(=O)—; —C(=O)O—; —C(=O)N(R19)-; —N(R19)-; —S—; —S(=O)—; —S(=O)$_2$—; and —S(=O)$_2$O—, or a group linking two or more of the groups selected from the third group, and R19 is hydrogen; deuterium; an alkyl group; a saturated hydrocarbon ring group; or an aromatic hydrocarbon group, two or more R19s being the same as or different from each other;

R17 is a saturated hydrocarbon ring group; and

L11, L12 and R17 are the same as or different from each other, and each independently optionally further substituted with deuterium; a halogen group; a hydroxyl group; an oxo group (=O); or an alkyl group.

4. The polymer (A) of claim 1, wherein R3 is represented by Chemical Formula 4:

[Chemical Formula 4]

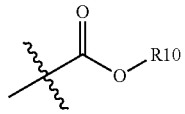

in the Chemical Formula 4,

R10 is any one group selected from the fourth group consisting of deuterium; a halogen group; a linear or branched alkyl group; a haloalkyl group; a saturated hydrocarbon ring group; an aromatic hydrocarbon group; a saturated heteroring group; an aromatic heteroring group; a ring group having two or more rings fused, each ring being selected from a saturated hydrocarbon ring, an aromatic hydrocarbon, a saturated heteroring and an aromatic heteroring; —OR'; —OC(=O)R'; —C(=O)R'; —C(=O)OR'; —C(=O)NR'$_2$; —NR'$_2$; —SR'; —S(=O)R'; —S(=O)$_2$R'; and —S(=O)$_2$OR', or a group linking two or more of the groups selected from the fourth group, and R' is hydrogen; deuterium; an alkyl group; a saturated hydrocarbon ring group; an aromatic hydrocarbon group; a saturated heteroring group; an aromatic heteroring group; or a ring group having at least two rings fused, each ring being selected from a saturated hydrocarbon ring, an aromatic hydrocarbon, a saturated heteroring and an aromatic heteroring, two or more R's being the same as or different from each other, and R10 is optionally further substituted with an oxo group.

5. The polymer (A) of claim 1, wherein the polymer (A) is a random copolymer comprising the structure unit represented by the Chemical Formula 1a; and the structure unit represented by the Chemical Formula 1c.

6. The polymer (A) of claim 1, comprising 80 mol % to 99.9 mol % of the structure unit represented by the Chemical Formula 1a based on the total structure units included in the polymer (A).

7. The polymer (A) of claim 1, comprising 0.1 mol % to 20 mol % of the structure unit represented by the Chemical Formula 1c based on the total structure units included in the polymer (A).

8. Photosensitive composition including the polymer (A) of claim 1.

9. Pattern including the polymer (A) of claim 1 or a cured material thereof.

10. A method for forming a pattern comprising:
(1) forming a photosensitive film on a substrate using the photosensitive composition of claim 8;
(2) selectively exposing the photosensitive film; and
(3) developing the exposed photosensitive film.

* * * * *